US011081443B1

United States Patent
Mizutani et al.

(10) Patent No.: US 11,081,443 B1
(45) Date of Patent: Aug. 3, 2021

(54) MULTI-TIER THREE-DIMENSIONAL MEMORY DEVICE CONTAINING DIELECTRIC WELL STRUCTURES FOR CONTACT VIA STRUCTURES AND METHODS OF FORMING THE SAME

(71) Applicant: SANDISK TECHNOLOGIES LLC, Addison, TX (US)

(72) Inventors: Yuki Mizutani, Milpitas, CA (US); Masayuki Hiroi, Yokkaichi (JP); Fumiaki Toyama, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/827,990

(22) Filed: Mar. 24, 2020

(51) Int. Cl.
*H01L 23/522* (2006.01)
*H01L 27/11519* (2017.01)
(Continued)

(52) U.S. Cl.
CPC ...... *H01L 23/5226* (2013.01); *H01L 23/5283* (2013.01); *H01L 27/1157* (2013.01);
(Continued)

(58) Field of Classification Search
CPC ......... H01L 27/11519; H01L 27/11524; H01L 27/11551; H01L 27/11556;
(Continued)

(56) References Cited

U.S. PATENT DOCUMENTS 9,224,747 B2 12/2015 Mizutani et al.
9,515,084 B2 12/2016 Oh et al.
(Continued)

FOREIGN PATENT DOCUMENTS

JP 2012119478 A 6/2012
KR 10-2013-0072522 A 7/2013
(Continued)

OTHER PUBLICATIONS

Notification of Transmittal of the International Search Report and Written Opinion of the International Search Authority or International Patent Application No. PCT/US2020/037846, dated Dec. 18, 2020, 8 pages.

(Continued)

*Primary Examiner* — Allison Bernstein
(74) *Attorney, Agent, or Firm* — The Marbury Law Group PLLC

(57) ABSTRACT

A first vertically alternating sequence of first insulating layers and first spacer material layers and a first-tier retro-stepped dielectric material portion are formed over a substrate. The first spacer material layers are formed as, or are subsequently replaced with, first electrically conductive layers. A second vertically alternating sequence of second insulating layers and second spacer material layers and a second-tier retro-stepped dielectric material portion are formed over the first vertically alternating sequence and the first-tier retro-stepped dielectric material portion. The second spacer material layers are formed as, or are subsequently replaced with, second electrically conductive layers. An opening is formed through the second vertically alternating sequence over the first-tier retro-stepped dielectric material portion, and is filled with a dielectric well structure. Contact via structures can be formed through the dielectric well structure and the first-tier retro-stepped dielectric material portion on the first electrically conductive layers.

20 Claims, 28 Drawing Sheets

(51) Int. Cl.
*H01L 27/11524* (2017.01)
*H01L 23/528* (2006.01)
*H01L 27/11565* (2017.01)
*H01L 27/1157* (2017.01)
*H01L 27/11582* (2017.01)
*H01L 27/11556* (2017.01)

(52) U.S. Cl.
CPC .. *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ........... H01L 27/11565; H01L 27/1157; H01L 27/11582; H01L 23/5226; H01L 23/5283; H01L 23/53295
See application file for complete search history.

(56) References Cited

U.S. PATENT DOCUMENTS

| | | | |
|---|---|---|---|
| 9,589,981 | B2 | 3/2017 | Nishikawa et al. |
| 9,646,981 | B2 | 5/2017 | Nishikawa et al. |
| 9,673,213 | B1 | 6/2017 | Yu et al. |
| 9,905,573 | B1 | 2/2018 | Mada et al. |
| 10,038,006 | B2 | 7/2018 | Furihata et al. |
| 10,115,681 | B1 | 10/2018 | Ariyoshi |
| 10,192,877 | B2 | 1/2019 | Norizuki et al. |
| 10,290,803 | B2 | 5/2019 | Sano et al. |
| 2012/0132983 | A1 | 5/2012 | Fukuzumi |
| 2016/0322376 | A1 | 11/2016 | Lee |
| 2016/0365351 | A1 | 12/2016 | Nishikawa et al. |
| 2016/0365352 | A1 | 12/2016 | Nishikawa et al. |
| 2017/0077118 | A1 | 3/2017 | Cheng et al. |
| 2017/0179152 | A1 | 6/2017 | Toyama et al. |
| 2017/0179153 | A1 | 6/2017 | Ogawa et al. |
| 2017/0207220 | A1 | 7/2017 | Yun et al. |
| 2018/0108667 | A1 | 4/2018 | Chang et al. |
| 2018/0301374 | A1 | 10/2018 | Masamori et al. |
| 2019/0043875 | A1 | 2/2019 | Parat et al. |
| 2019/0043879 | A1 | 2/2019 | Lu et al. |
| 2019/0043890 | A1 | 2/2019 | Dorhout et al. |
| 2019/0057974 | A1 | 2/2019 | Lu et al. |
| 2019/0081060 | A1 | 3/2019 | Lu et al. |
| 2019/0123054 | A1 | 4/2019 | Chen et al. |
| 2019/0139974 | A1 | 5/2019 | Sugawara et al. |
| 2019/0221574 | A1 | 7/2019 | Shimabukuro et al. |
| 2019/0237391 | A1 | 8/2019 | Sattiraju et al. |
| 2019/0252396 | A1 | 8/2019 | Mushiga et al. |
| 2019/0280001 | A1 | 9/2019 | Terasawa et al. |
| 2019/0280002 | A1 | 9/2019 | Kai et al. |
| 2019/0280003 | A1 | 9/2019 | Mushiga et al. |
| 2019/0319040 | A1 | 10/2019 | Ishii et al. |
| 2019/0341399 | A1 | 11/2019 | Tao et al. |
| 2019/0348435 | A1 | 11/2019 | Nagata et al. |
| 2019/0363097 | A1 | 11/2019 | Chang et al. |
| 2020/0020715 | A1 | 1/2020 | Nakamura et al. |
| 2020/0035699 | A1 | 1/2020 | Liu et al. |

FOREIGN PATENT DOCUMENTS

| | | |
|---|---|---|
| KR | 10-2017-0014757 A | 2/2017 |
| KR | 10-2017-0057060 A | 5/2017 |
| KR | 10-2019-0051694 A | 5/2019 |

OTHER PUBLICATIONS

Endoh et al., "Novel Ultra High Density Memory with a Stacked-Surrounding Gate Transistor (S-SGT) Structured Cell," IEDM Proc. (2001) 33-36.
U.S. Appl. No. 16/362,988, filed Mar. 25, 2019, SanDisk Technologies LLC.
U.S. Appl. No. 16/547,971, filed Aug. 22, 2019, SanDisk Technologies LLC.
U.S. Appl. No. 16/675,459, filed Nov. 6, 2019, SanDisk Technologies LLC.
U.S. Appl. No. 16/671,561, filed Nov. 1, 2019, SanDisk Technologies LLC.
U.S. Appl. No. 16/782,307, filed Feb. 5, 2020, SanDisk Technologies LLC.

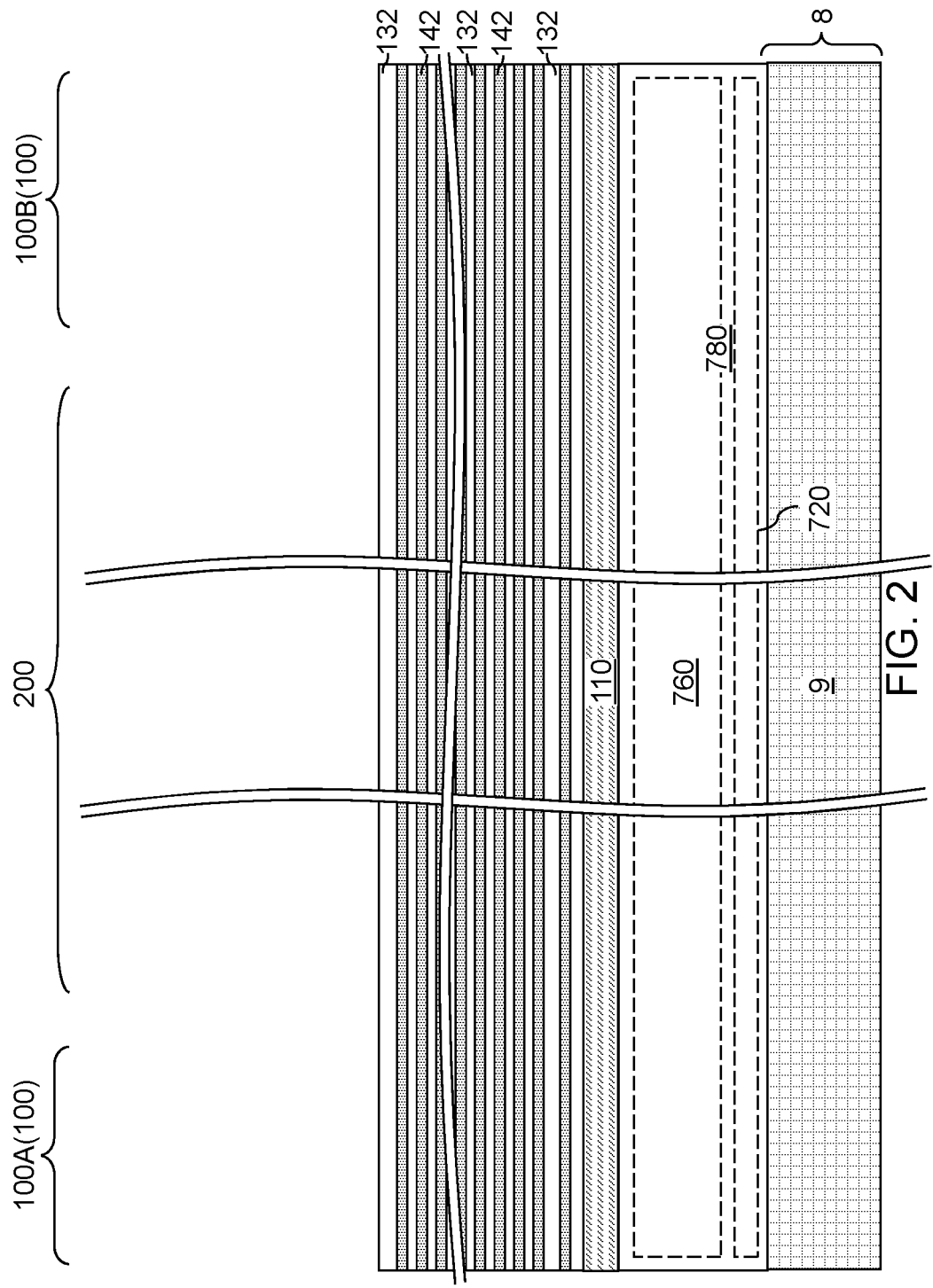

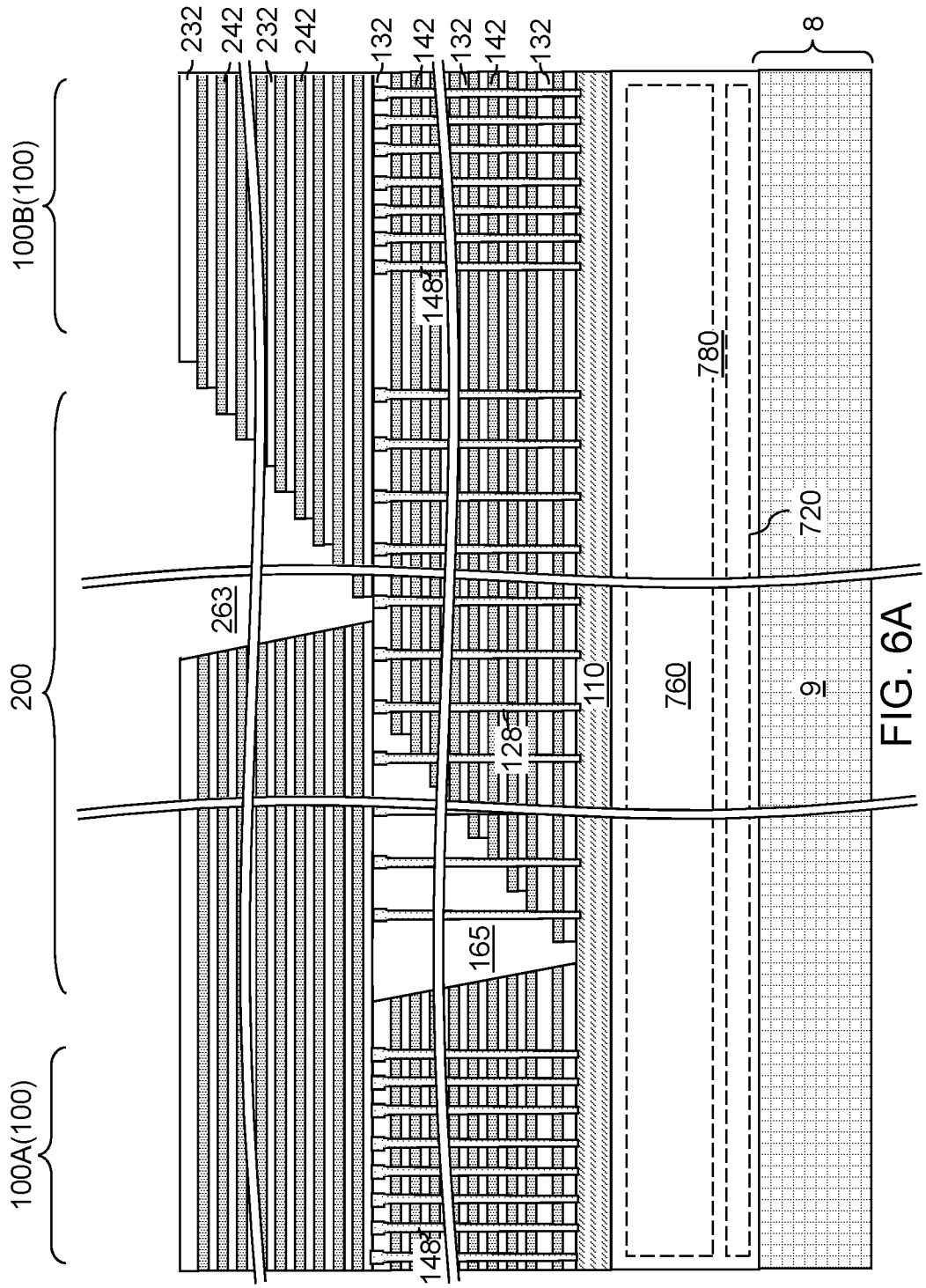

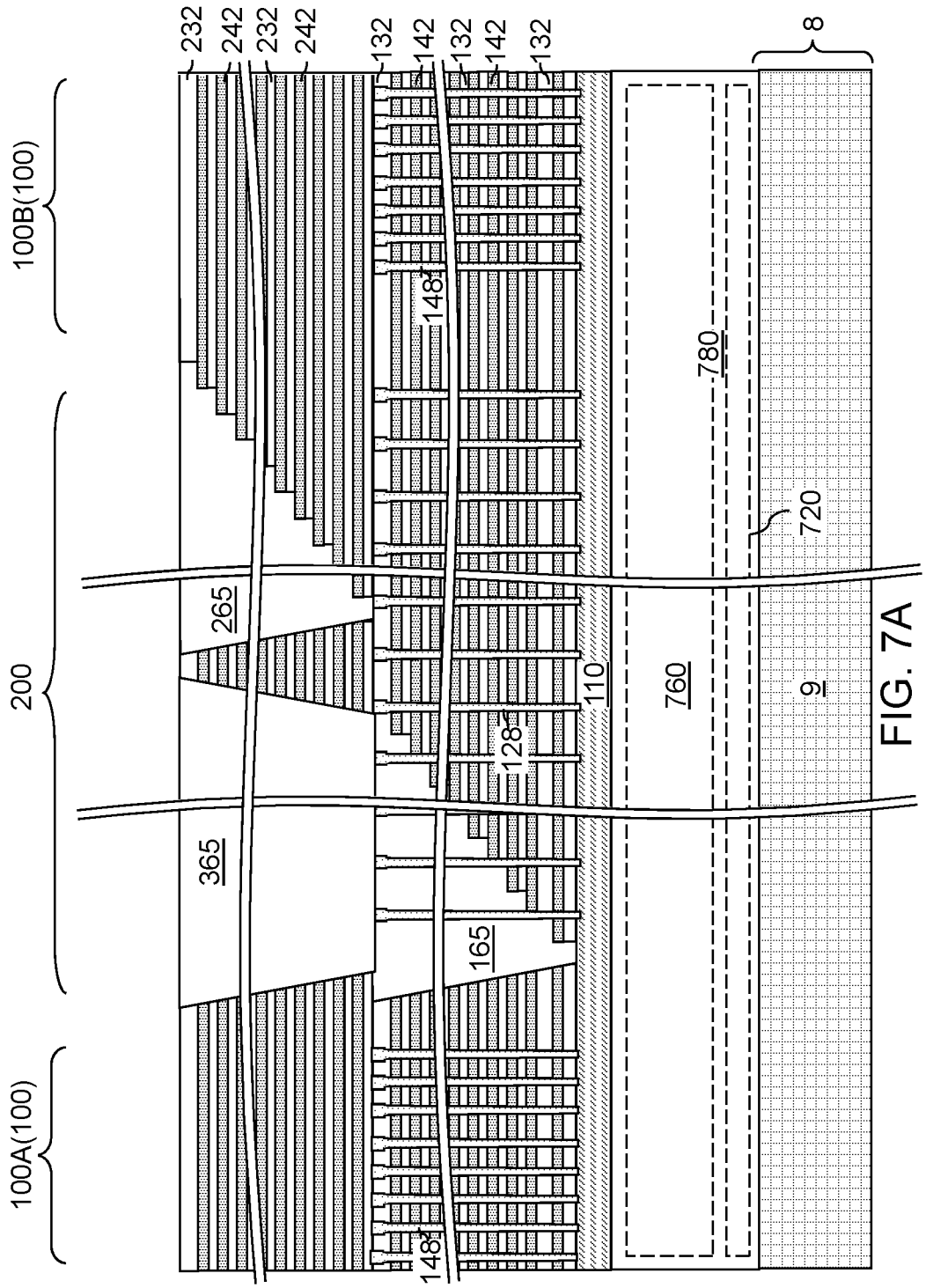

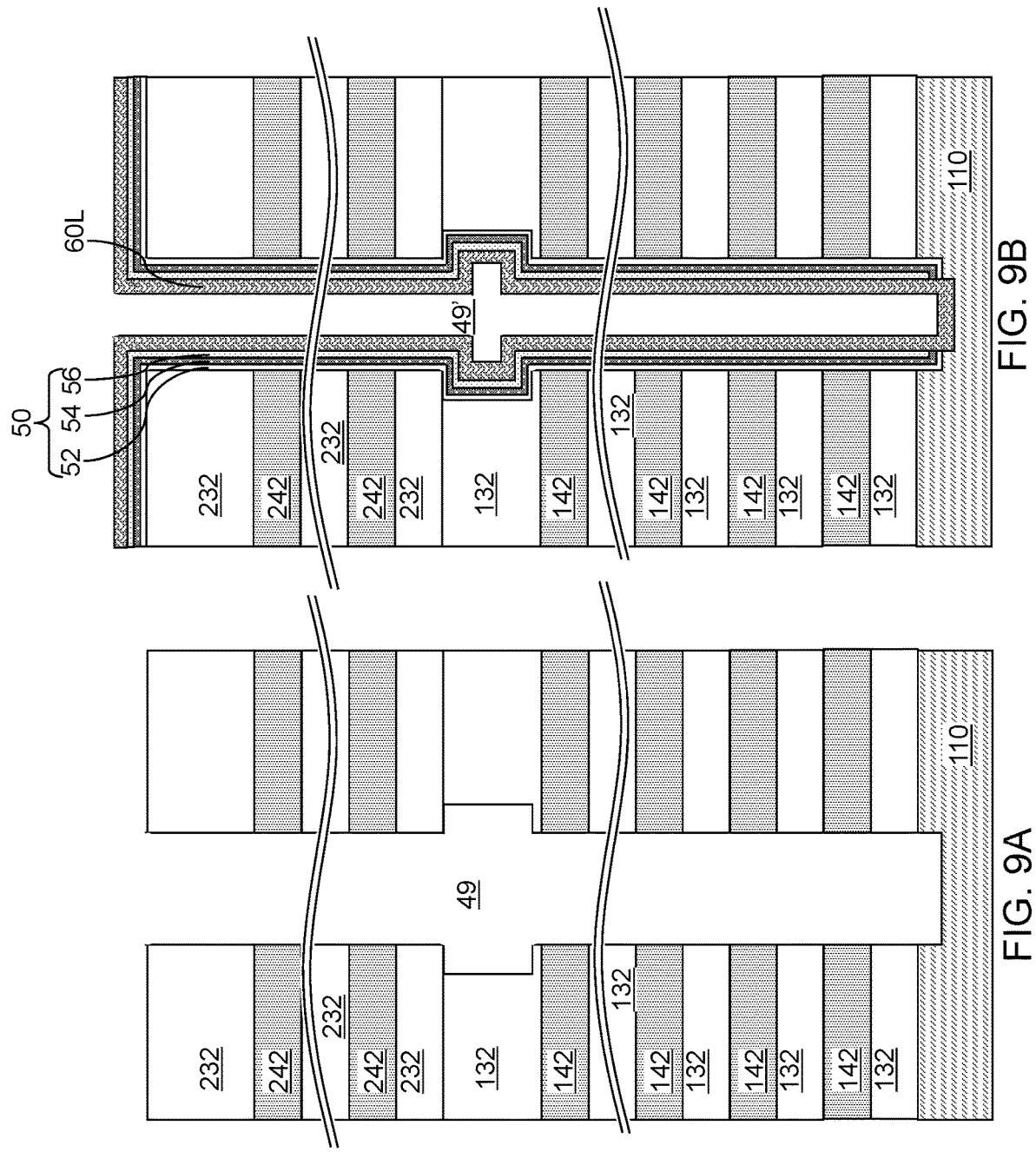

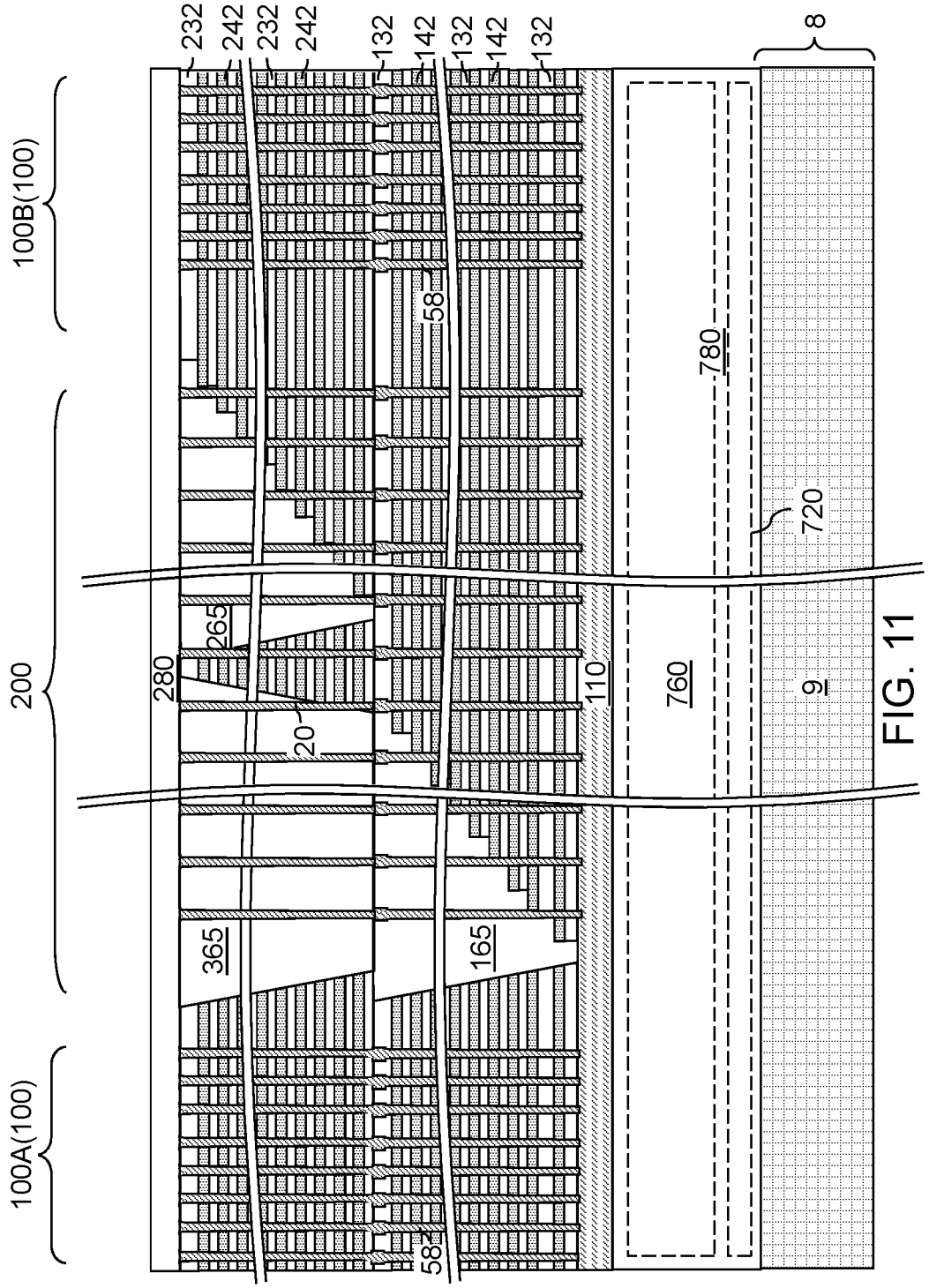

MULTI-TIER THREE-DIMENSIONAL MEMORY DEVICE CONTAINING DIELECTRIC WELL STRUCTURES FOR CONTACT VIA STRUCTURES AND METHODS OF FORMING THE SAME

FIELD

The present disclosure relates generally to the field of semiconductor devices, and particularly to a multi-tier three-dimensional memory device including dielectric well structures for contact via structures and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: a first-tier alternating stack of first insulating layers and first electrically conductive layers located over a substrate; a first-tier retro-stepped dielectric material portion overlying first stepped surfaces of the first-tier alternating stack; a second-tier alternating stack of second insulating layers and second electrically conductive layers, wherein the second-tier alternating stack overlies the first-tier alternating stack and overlies a horizontal plane including a planar top surface of the first-tier retro-stepped dielectric material portion; memory opening fill structures located within a first memory array region and vertically extending through each layer within the first-tier alternating stack and the second-tier alternating stack, wherein each of the memory opening fill structures comprises a respective memory film and a respective vertical semiconductor channel; a second-tier retro-stepped dielectric material portion overlying second stepped surfaces of the second-tier alternating stack and extending through a first lateral recess region of the second-tier alternating stack; and a dielectric well structure contacting a top surface of the first-tier retro-stepped dielectric material portion and extending through a second lateral recess region of the second-tier alternating stack.

According to another aspect of the present disclosure, a method of forming a three-dimensional memory device is provided, which comprises: forming a first vertically alternating sequence of first insulating layers and first spacer material layers and a first-tier retro-stepped dielectric material portion overlying first stepped surfaces of the first vertically alternating sequence over a substrate, wherein the first spacer material layers are formed as, or are subsequently replaced with, first electrically conductive layers; forming a second vertically alternating sequence of second insulating layers and second spacer material layers over the first vertically alternating sequence and the first-tier retrostepped dielectric material portion, wherein the second spacer material layers are formed as, or are subsequently replaced with, second electrically conductive layers; forming second stepped surfaces within a first opening through the second alternating stack by patterning the second alternating stack; forming a second-tier retro-stepped dielectric material portion over the second stepped surfaces in the first opening through the second vertically alternating sequence; forming a second opening through the second vertically alternating sequence over the first-tier retro-stepped dielectric material portion; and forming a dielectric well structure through the second vertically alternating sequence on a top surface of the first-tier retro-stepped dielectric material portion.

BRIEF DESCRIPTION OF THE DRAWINGS

FIG. 2 is a vertical cross-sectional view of an exemplary structure for forming a semiconductor die after formation of optional semiconductor devices, optional lower level dielectric layers, optional lower metal interconnect structures, a semiconductor material layer, and a first vertically alternating sequence of first insulating layers and first spacer material layers according to an embodiment of the present disclosure.

FIG. 6A is a vertical cross-sectional view of the exemplary structure after formation of second-tier retro-stepped dielectric material portions according to an embodiment of the present disclosure.

FIG. 7A is a vertical cross-sectional view of the exemplary structure after formation of dielectric well structures according to an embodiment of the present disclosure.

FIGS. 9A-9D illustrate sequential vertical cross-sectional views of a memory opening during formation of a memory opening fill structure according to an embodiment of the present disclosure.

FIG. 11 is a vertical cross-sectional view of the exemplary structure after formation of a contact-level dielectric layer according to an embodiment of the present disclosure.

DETAILED DESCRIPTION

Figure 1A:
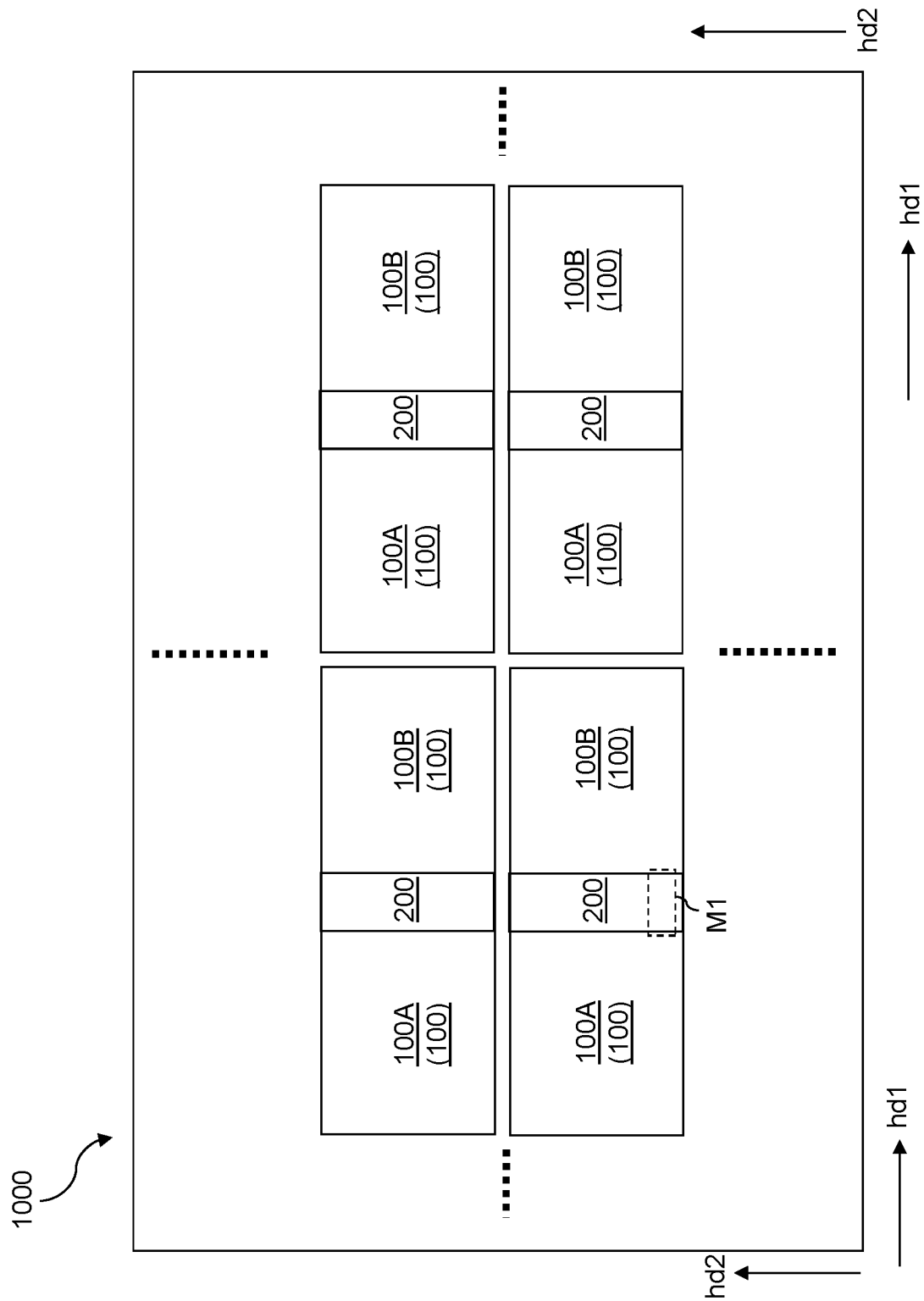
FIG. 1A is a plan view of a semiconductor die including multiple three-dimensional memory array regions according to an embodiment of the present disclosure.

As discussed above, the embodiments of the present disclosure are directed to a multi-tier three-dimensional memory device including dielectric well structures for contact via structures and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1G, a semiconductor die 1000 including multiple three-dimensional memory array regions and inter-array region is illustrated in various views. The semiconductor die 1000 can include multiple planes, each of which includes two memory array regions 100, such as a first memory array region 100A and a second memory array region 100B that are laterally spaced apart by a respective inter-array region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction hd1 (which may be the word line direction). A second horizontal direction hd2 (which may be the bit line direction) can be perpendicular to the first horizontal direction hd1.

Each memory array region 100 includes first-tier alternating stacks of first insulating layers 132 and first electrically conductive layers 146 (which function as first word lines) and second-tier alternating stacks of second insulating layers 232 and second electrically conductive layers 246 (which function as second word lines). Each second-tier alternating stack (232, 246) overlies a respective first-tier alternating stack (132, 246), and each first-tier alternating stack (132, 146) underlies a respective second-tier alternating stack (232, 246). Each combination of a first-tier alternating stack (132, 146) and an overlying second-tier alternating stack (232, 246) may be laterally spaced apart from neighboring combinations of a respective first-tier alternating stack (132, 146) and a respective second-tier alternating stack (232, 246) by backside trench fill structures 76 that laterally extend along the first horizontal direction hd1.

The exemplary structure can include an optional semiconductor material layer 110 that includes a single crystalline or polycrystalline semiconductor material, such as single crystalline silicon or polysilicon. In one embodiment, the semiconductor material layer 110 may be a substrate. Optionally, underlying dielectric material layers may be provided underneath the semiconductor material layer 110. In this case, the underlying dielectric material layers are referred to as lower-level dielectric material layers 760.

A first-tier alternating stack of first insulating layers 132 and first electrically conductive layers 146 is located over a substrate (which may include the semiconductor material layer 110 or another structure, such as a silicon wafer) that underlies the semiconductor material layer 110) between each neighboring pair of backside trench fill structures 76. A first-tier retro-stepped dielectric material portion 165 overlies, and contacts, first stepped surfaces of the first-tier alternating stack (132, 146). A second-tier alternating stack of second insulating layers 232 and second electrically conductive layers 246 overlies the first-tier alternating stack (132, 146), and overlies a horizontal plane including a planar top surface of the first-tier retro-stepped dielectric material portion 165 between each neighboring pair of backside trench fill structures 76. A second-tier retro-stepped dielectric material portion 265 overlies, and contacts, second stepped surfaces of the second-tier alternating stack (132, 146). Vertical steps S of the first stepped surfaces and the second stepped surfaces laterally extend along the second horizontal direction hd2 (e.g., bit line direction).

Memory opening fill structures 58 can be located within each memory array region 100 (which includes a first memory array region 100A and a second memory array region 100B) between each neighboring pair of backside trench fill structures 76. The memory opening fill structures 58 can be located within memory openings that vertically extend through each layer within the first-tier alternating stack (132, 146) and the second-tier alternating stack (232, 246) that are located between a respective neighboring pair of backside trench fill structures 76. Each of the memory opening fill structures 58 comprises a respective memory film and a respective vertical semiconductor channel, as will be described in more detail below.

A second-tier retro-stepped dielectric material portion 265 overlies second stepped surfaces of the second-tier alternating stack (232, 246) and extends through a first lateral recess region of the second-tier alternating stack (232, 246) located between each neighboring pair of backside trench fill structures 76. A dielectric well structure 365 comprising and/or consisting essentially of at least one dielectric material, contacts a top surface of the first-tier retro-stepped dielectric material portion 165 and extends through a second lateral recess region of the second-tier alternating stack (232, 246) located between each neighboring pair of backside trench fill structures 76. As used herein, a "lateral recess region" of a structure refers to a region in which a non-horizontal sidewall of the structure is laterally recessed with respect to additional sidewalls of the structure.

A contact-level dielectric layer 280 can be provided over each second-tier alternating stack (232, 246). In one embodiment, first contact via structures 86A vertically extend through the dielectric well structure 365 and the first-tier retro-stepped dielectric material portion 165, and contact a respective one of the first electrically conductive layers 146. Second contact via structures 86B vertically extend through the second-tier retro-stepped dielectric material portion 265 and contact a respective one of the second electrically conductive layers 246.

For each combination of a first-tier alternating stack (132, 146) and an overlying second-tier alternating stack (232, 246), a respective first backside trench fill structure 76 laterally extends along the first horizontal direction hd1 (e.g., word line direction) and contacts first sidewalls of the first-tier alternating stack (132, 146) and first sidewalls of the second-tier alternating stack (232, 246), and a second backside trench fill structure 76 laterally extends along the first horizontal direction hd1 and contacts second sidewalls of the first-tier alternating stack (132, 146) and second sidewalls of the second-tier alternating stack (232, 246).

In one embodiment, each dielectric well structure 365 can be located between a laterally neighboring pair of backside trench fill structures 76, which are herein referred to as a respective first backside trench fill structure 76 and a respective second backside trench fill structure 76. Each dielectric well structure 365 comprises a first tapered sidewall that laterally extends along the first horizontal direction hd1 and located between and laterally spaced from each of the respective first backside trench fill structure 76 and the respective second backside trench fill structure 76.

In one embodiment, each dielectric well structure 365 located between a respective laterally neighboring pair of backside trench fill structures 76 can comprise a pair of second tapered sidewalls that laterally extend along the second horizontal direction hd2. The entirety of each of the second tapered sidewalls of the dielectric well structure 365 contacts a respective sidewall of the second-tier alternating stack (232, 246). The first tapered sidewall and the pair of second tapered sidewalls of a dielectric well structure 365 define the lateral extent of the second lateral recess region of the second-tier alternating stack (232, 246).

In one embodiment, the entirety of the bottom surface of each dielectric well structure 365 can be in contact with a top surface of an underlying first-tier retro-stepped dielectric material portion 165. A first portion of the periphery of the bottom surface of each dielectric well structure 365 can be laterally offset inward from a first portion of the periphery of the top surface of a respective underlying first-tier retro-stepped dielectric material portion 165. A second portion of the periphery of the bottom surface of each dielectric well structure 365 can coincide with a second portion of the periphery of the top surface of the respective underlying first-tier retro-stepped dielectric material portion 165.

Figure 1B:
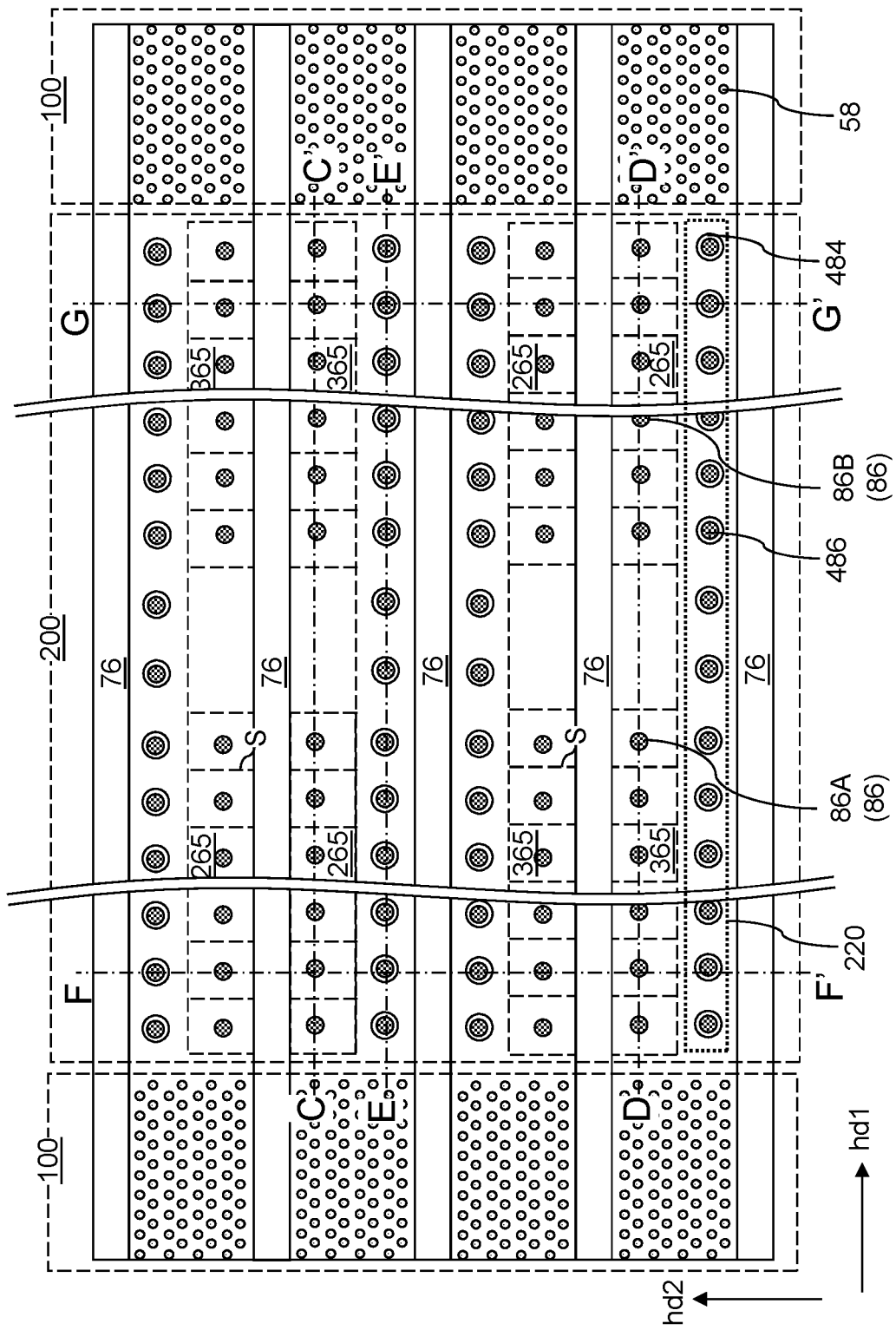
FIG. 1B is a schematic see-through top-down view of region Ml of FIG. 1A.
Figure 1C:
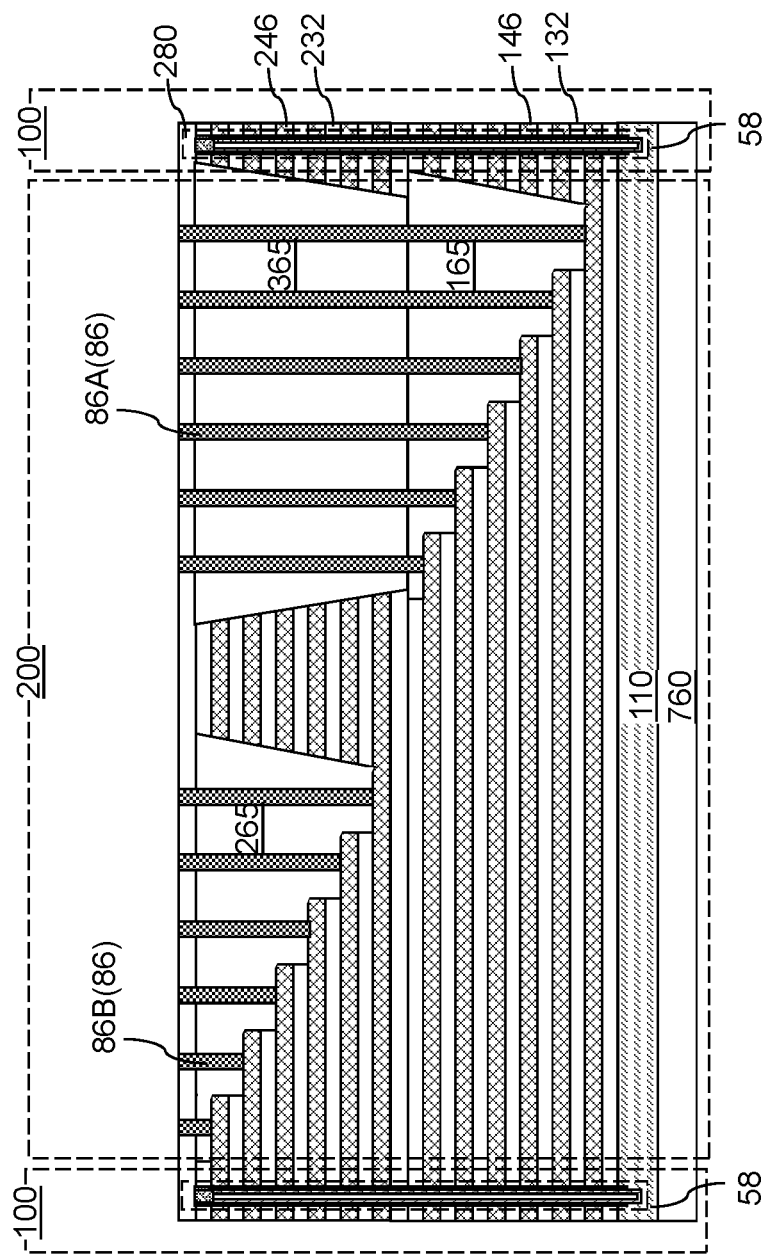
FIG. 1C is a schematic vertical cross-sectional view of a region of the semiconductor die along the vertical plane C-C' of FIG. 1B.
Figure 1D:
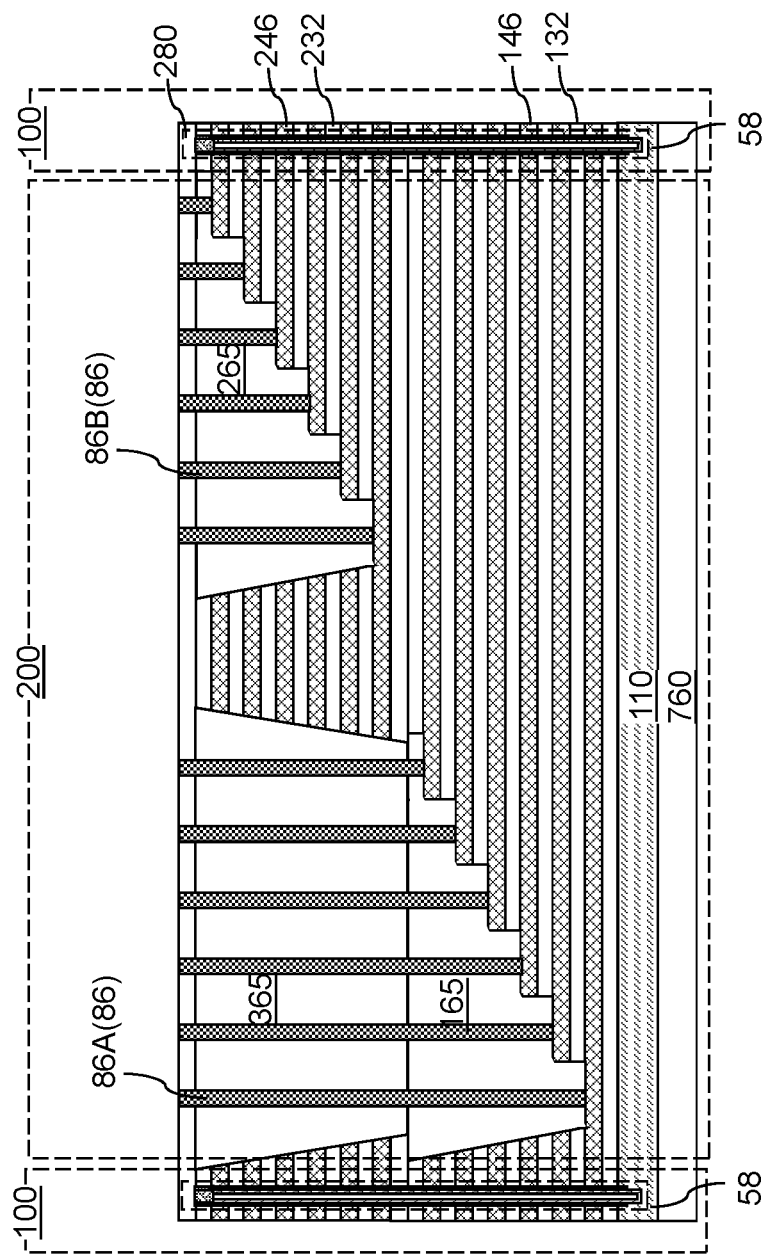
FIG. 1D is a schematic vertical cross-sectional view of a region of the semiconductor die along the vertical plane D-D' of FIG. 1B.

Additional memory opening fill structures 58 can be located within a second memory array region 100B that is laterally offset along the first horizontal direction hd1 from the first memory array region 100A by the second-tier retro-stepped dielectric material portion 265 and the dielectric well structure 365. Each layer of the first-tier alternating stack (132, 146) and each layer of the second-tier alternating stack (232, 246) are present within the second memory array region 100B. At least a portion of the first electrically conductive layers 146 and at least a portion of the second electrically conductive layers 246 continuously extend from the first memory array region 100A to the second memory array region 100B through an array interconnection region (e.g., "bridge" region) 220 located between the backside trench fill structures 76 each of the second-tier retro-stepped dielectric material portion 265 and the dielectric well structure 365, as shown in FIG. 1B. At least a portion of the first electrically conductive layers 146 and at least a portion of the second electrically conductive layers 246 contact both of the second-tier retro-stepped dielectric material portion 265 and the dielectric well structure 365.

In one embodiment, the second-tier retro-stepped dielectric material portion 265 and the dielectric well structure 365 comprise a same dielectric material and are laterally spaced apart from each other along the first horizontal direction by a portion of the second-tier alternating stack (232, 246) that laterally extends along the second horizontal direction hd2 that is perpendicular to the first horizontal direction hd1.

Each combination of a first-tier alternating stack (132, 146) and an overlying second-tier alternating stack (232, 246) can be located between a respective neighboring pair of backside trench fill structures 76. Thus, for each combination of a first-tier alternating stack (132, 146) and an overlying second-tier alternating stack (232, 246), a neighboring combination of an additional first-tier alternating stack (132, 146) and an additional second-tier alternating stack (232, 246) may be provided. A structure that is adjacent to each combination of a first-tier alternating stack (132, 146) and an overlying second-tier alternating stack (232, 246) can include an additional first-tier alternating stack of additional first insulating layers 132 and additional first electrically conductive layers 146 located over the substrate, an additional first-tier retro-stepped dielectric material portion 165 overlying additional first stepped surfaces of the additional first-tier alternating stack (132, 146), an additional second-tier alternating stack of additional second insulating layers 232 and additional second electrically conductive layers 246, additional memory opening fill structures 58 located within an additional memory array region 100B and vertically extending through each layer within the additional first-tier alternating stack (132, 146) and the additional second-tier alternating stack (232, 246), an additional second-tier retro-stepped dielectric material portion 265 overlying additional second stepped surfaces of the additional second-tier alternating stack (232, 246) and extending through an additional lateral recess region in the additional second-tier alternating stack (232, 246), an additional dielectric well structure 365 contacting a top surface of the additional first-tier retro-stepped dielectric material portion 165 and extending through an additional second lateral recess region in the additional second-tier alternating stack (232, 246), and a backside trench fill structure 76 laterally extending along the first horizontal direction hd1 and contacting sidewalls of the first-tier alternating stack (132, 146), sidewalls of the second-tier alternating stack (232, 246), sidewalls of the additional first-tier alternating stack (132, 146), and sidewalls of the additional second-tier alternating stack (232, 246). The additional second-tier alternating stack (232, 246) overlies the additional first-tier alternating stack (132, 146) and overlies a horizontal plane including the planar top surface of the first-tier retro-stepped dielectric material portion 165.

The dielectric well structure 365 and the additional dielectric well structure 365 can be diagonally spaced apart from each other with a backside trench fill structure 76 therebetween, and the second-tier retro-stepped dielectric material portion 265 and the additional second-tier retro-stepped dielectric material portion 265 can be diagonally spaced apart from each other with the backside trench fill structure 76 therebetween. In one embodiment, a lateral offset distance between the dielectric well structure 365 and the additional second-tier retro-stepped dielectric material portion 265 (which can be the same as the width of the backside trench fill structure 76 along the second horizontal direction hd2) is less than a lateral offset distance between the dielectric well structure 365 and the additional dielectric well structure 365. Likewise, a lateral offset distance between the second-tier retro-stepped dielectric material portion 265 and the additional dielectric well structure 365 (which can be the same as the width of the backside trench fill structure 76 along the second horizontal direction hd2) is less than a lateral offset distance between the second-tier retro-stepped dielectric material portion 265 and the additional second-tier retro-stepped dielectric material portion 265.

Staircases including the first stepped surfaces and the second stepped surfaces of combinations of a first-tier alternating stack (132, 146) and an overlying second-tier alternating stack (232, 246) can rise from the substrate along the first horizontal direction hd1, or along the opposite direction of the first horizontal direction hd1. In one embodiment, the direction of rise of the staircases can change for every other pair of combinations of a respective first-tier alternating stack (132, 146) and a respective second-tier alternating stack (232, 246). In other words, the direction of rise is staggered in adjacent alternating stacks that are separated along the second horizontal direction. For example, upon sequentially numbering each combination of a respective first-tier alternating stack (132, 146) and a respective second-tier alternating stack (232, 246) with positive integers N starting with 1, each (4N+1)-th combination and each (4N+2)-th combination of a respective first-tier alternating stack (132, 146) and a respective second-tier alternating stack (232, 246) can have stairs that rise along the first horizontal direction hd1, and each (4N+3)-th combination and each (4N+4)-th combination of a respective first-tier alternating stack (132, 146) and a respective second-tier alternating stack (232, 246) can have stairs that rise along the opposite direction of the first horizontal direction hd1.

In one embodiment, a vertical distance between the first stepped surfaces and the substrate increases along the first horizontal direction hd1, a vertical distance between the second stepped surfaces and the substrate increases along the first horizontal direction hd1, a vertical distance between the additional first stepped surfaces and the substrate decreases along the first horizontal direction hd1, and a vertical distance between the additional second stepped surfaces and the substrate decreases along the first horizontal direction hd1.

A bridge region 240 including strips of the first insulating layers 132, the first electrically conductive layers 146, the second insulating layers 232, and the second electrically conductive layers 246 can be located between a laterally neighboring pair of backside trench fill structures 76 and adjacent to a respective combination of a first-tier retro-stepped dielectric material portion 165, a dielectric well structure 365, and a second-tier retro-stepped dielectric material portion 265. Each strip of the first insulating layers 132, the first electrically conductive layers 146, the second insulating layers 232, and the second electrically conductive layers 246 can continuously extend from the first memory array region 100A to the second memory array region 100B.

Figure 1E:
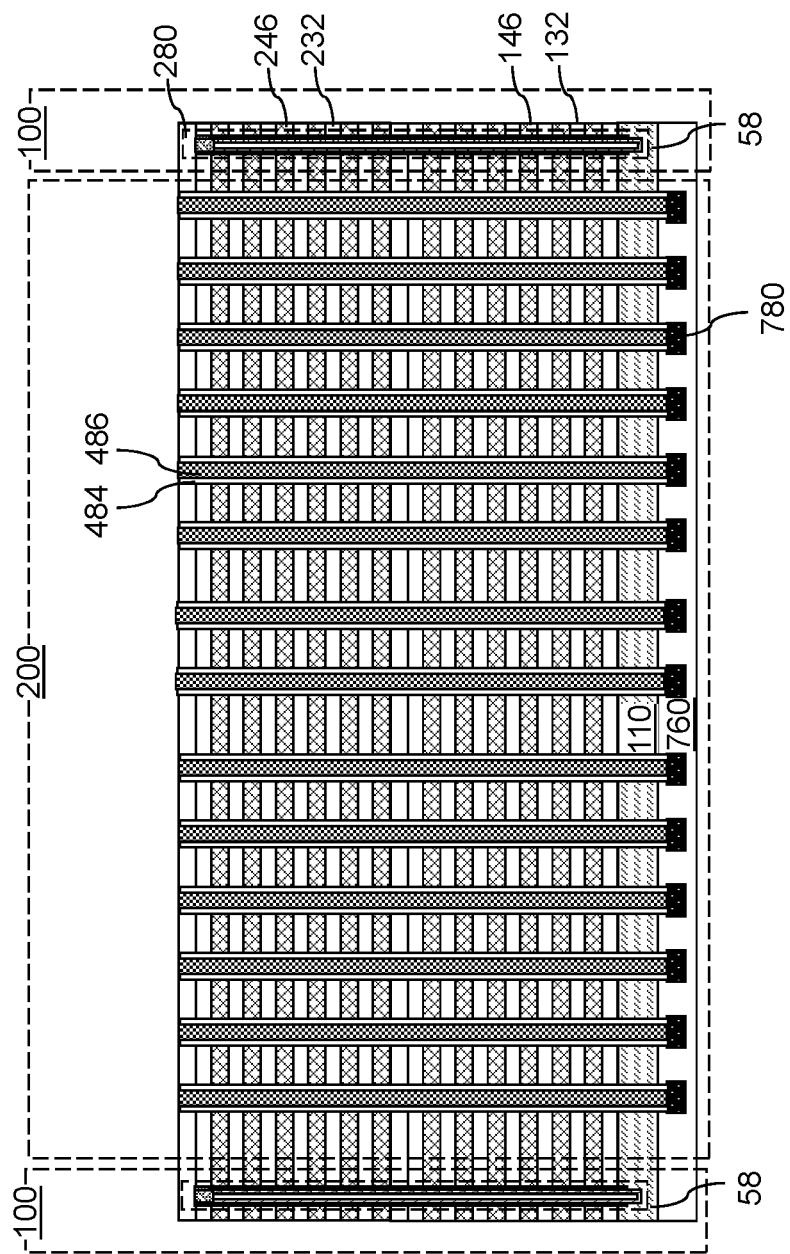
FIG. 1E is a schematic vertical cross-sectional view of a region of the semiconductor die along the vertical plane E-E' of FIG. 1B.
Figure 1F:
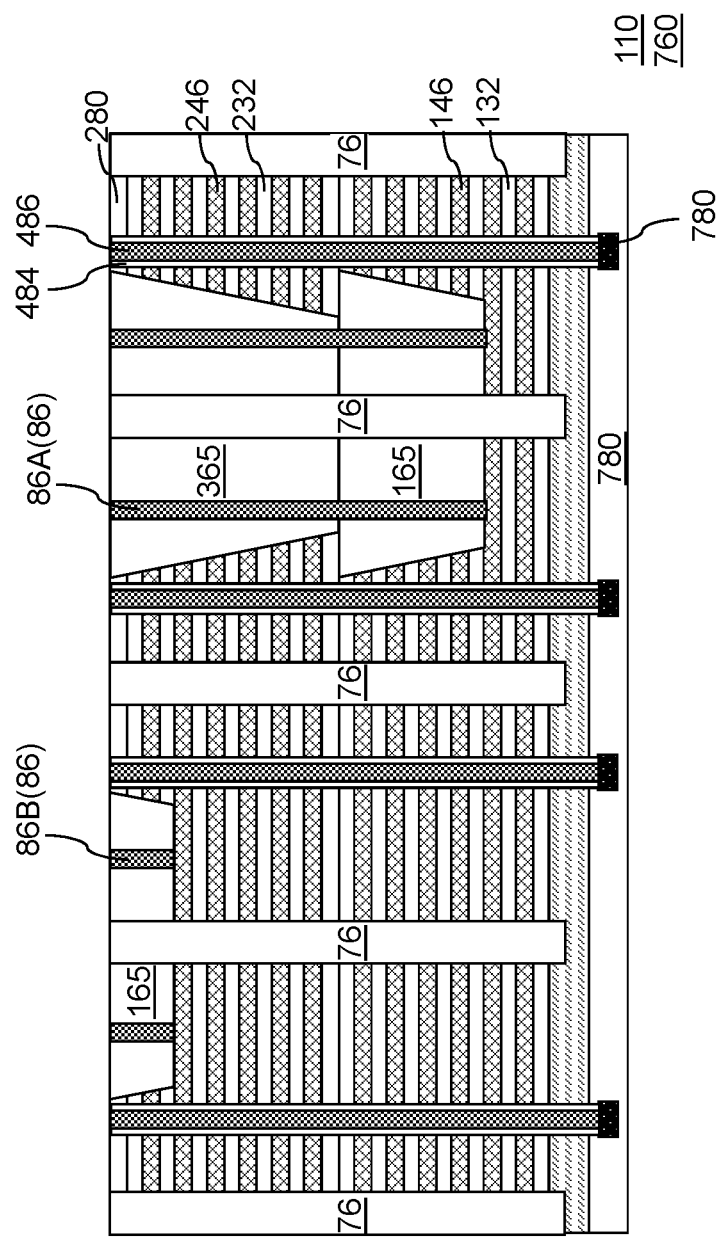
FIG. 1F is a schematic vertical cross-sectional view of a region of the semiconductor die along the vertical plane F-F' of FIG. 1B.
Figure 1G:
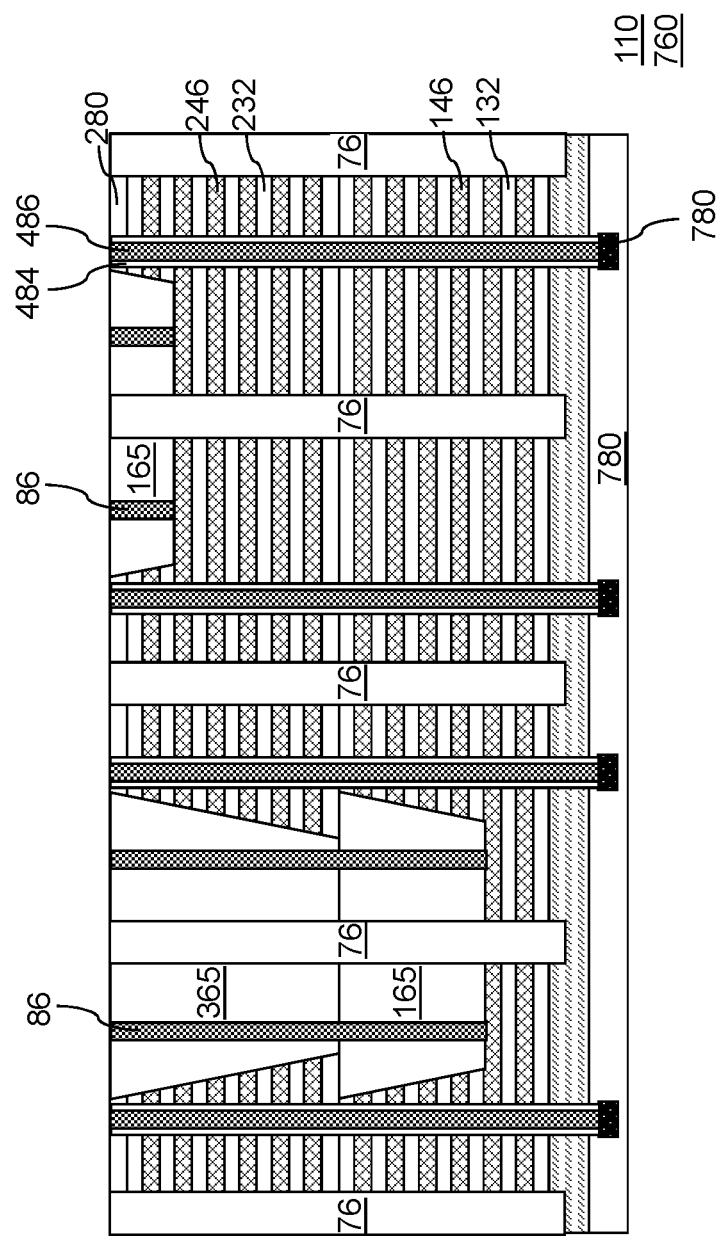
FIG. 1G is a schematic vertical cross-sectional view of a region of the semiconductor die along the vertical plane G-G' of FIG. 1B.

Laterally-isolated vertical interconnection structures (484, 486) can be formed through the bridge region 240. Each laterally-isolated vertical interconnection structure (484, 486) can include a through-memory-level conductive via structure 486 and a tubular insulating spacer 484 that laterally surrounds the conductive via structure 486. Each through-memory-level conductive via structure 486 can contact a lower-level metal interconnect structure 780 located in the lower-level dielectric material layers 760, as shown in FIG. 1E. Drain contact via structures (shown in FIG. 14A) can extend through the contact-level dielectric layer 280, and can contact an upper portion of a respective memory opening fill structure 58 (such as a drain region within the respective memory opening fill structure 58). Bit lines (not shown) can laterally extend along the second horizontal direction hd2, and can contact top surfaces of a respective subset of the drain contact via structures. Additional metal interconnect structures embedded in overlying dielectric material layers (not shown) may be employed to provide electrical connection among the various nodes of the three-dimensional memory device located in the semiconductor die 1000.

The exemplary structure of FIGS. 1A-1G can be manufactured employing a sequence of processing steps. Referring to FIG. 2, an exemplary structure for formation of the structure of FIGS. 1A-1G is illustrated in a vertical cross sectional view along the first horizontal direction (e.g., word line direction) hd1. The structure shown in FIG. 2 is provided after formation of semiconductor devices 720 on a substrate semiconductor layer 9 (which is provided at least within an upper portion of a substrate 8), lower level dielectric layers 760, lower-level metal interconnect structures 780 (schematically represented by a dotted area including physical implementations of the lower level metal interconnect structures) that are embedded in the lower-level dielectric layers 760, a semiconductor material layer 110, and a first vertically alternating sequence of first insulating layers 132 and first spacer material layers, which can include first sacrificial material layers 142. The substrate semiconductor layer 9 may comprise a top portion (e.g., a doped well) of a semiconductor substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element. Generally, spacer material layers within each alternating stack are formed as, or are subsequently replaced with, electrically conductive layers. As such, the first spacer material layers can be formed as, or can be subsequently replaced with, first electrically conductive layers 146.

The first insulating layers 132 can be composed of the first material, and the first sacrificial material layers 142 can be composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first spacer material layers may be formed as first electrically conductive layers (which may include TiN, TaN, WN, W, Ru, Co, Mo, Cu, or a combination thereof), or may be formed as first sacrificial material layers that are subsequently replaced within first electrically conductive layers. In case the first spacer material layers are formed as first spacer material layers, the first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride. While the present disclosure is described employing an embodiment in which the first spacer material layers are formed as first sacrificial material layers 142, embodiments are expressly contemplated herein in which the first spacer material layers are formed as first electrically conductive layers. In this case, processing steps employed to replace the first sacrificial material layers 142 with first electrically conductive layers may be omitted.

Figure 3A:
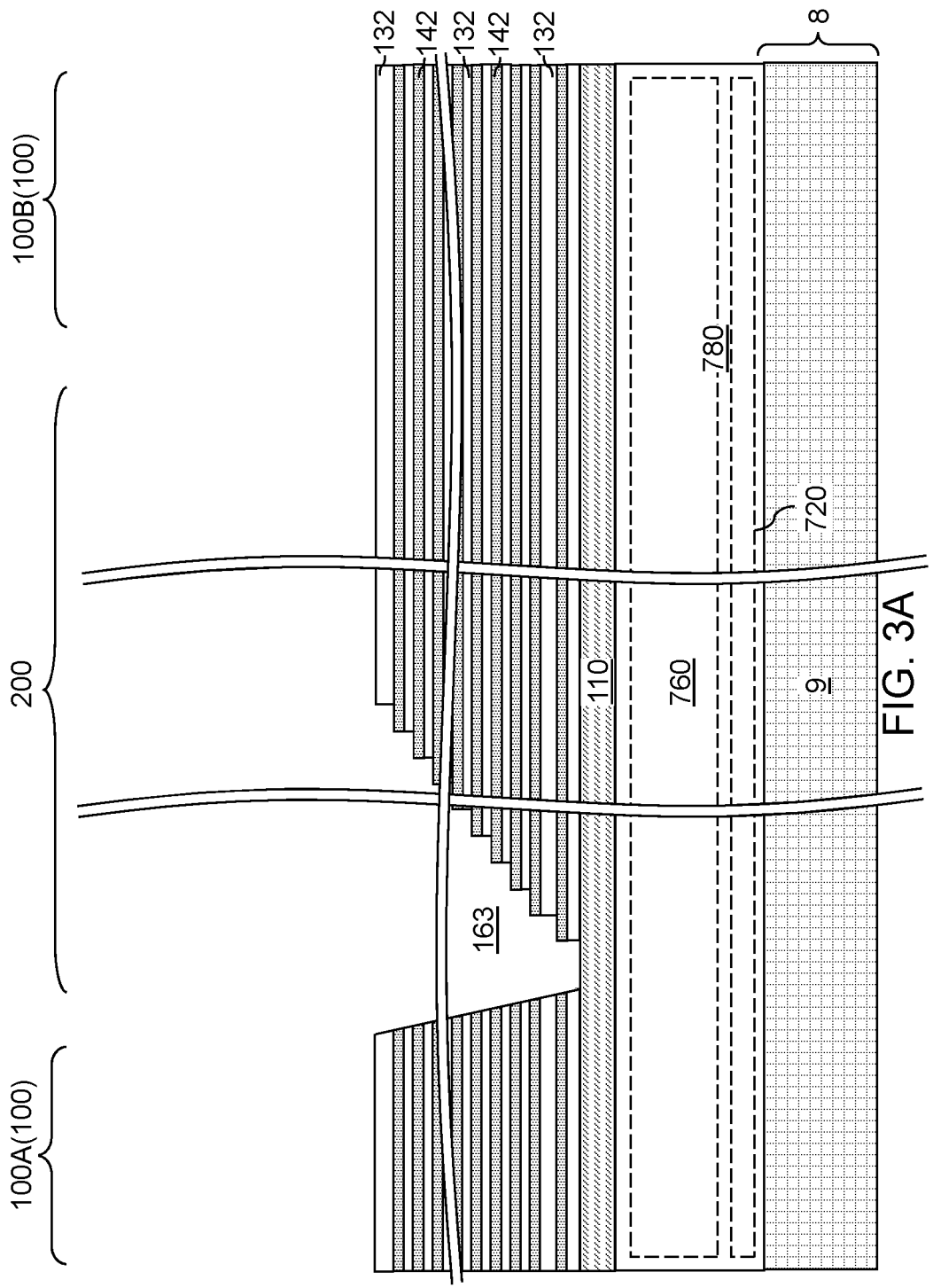
FIG. 3A is a vertical cross-sectional view of the exemplary structure after formation of first stepped surfaces in the inter-array region according to an embodiment of the present disclosure.
Figure 3B:
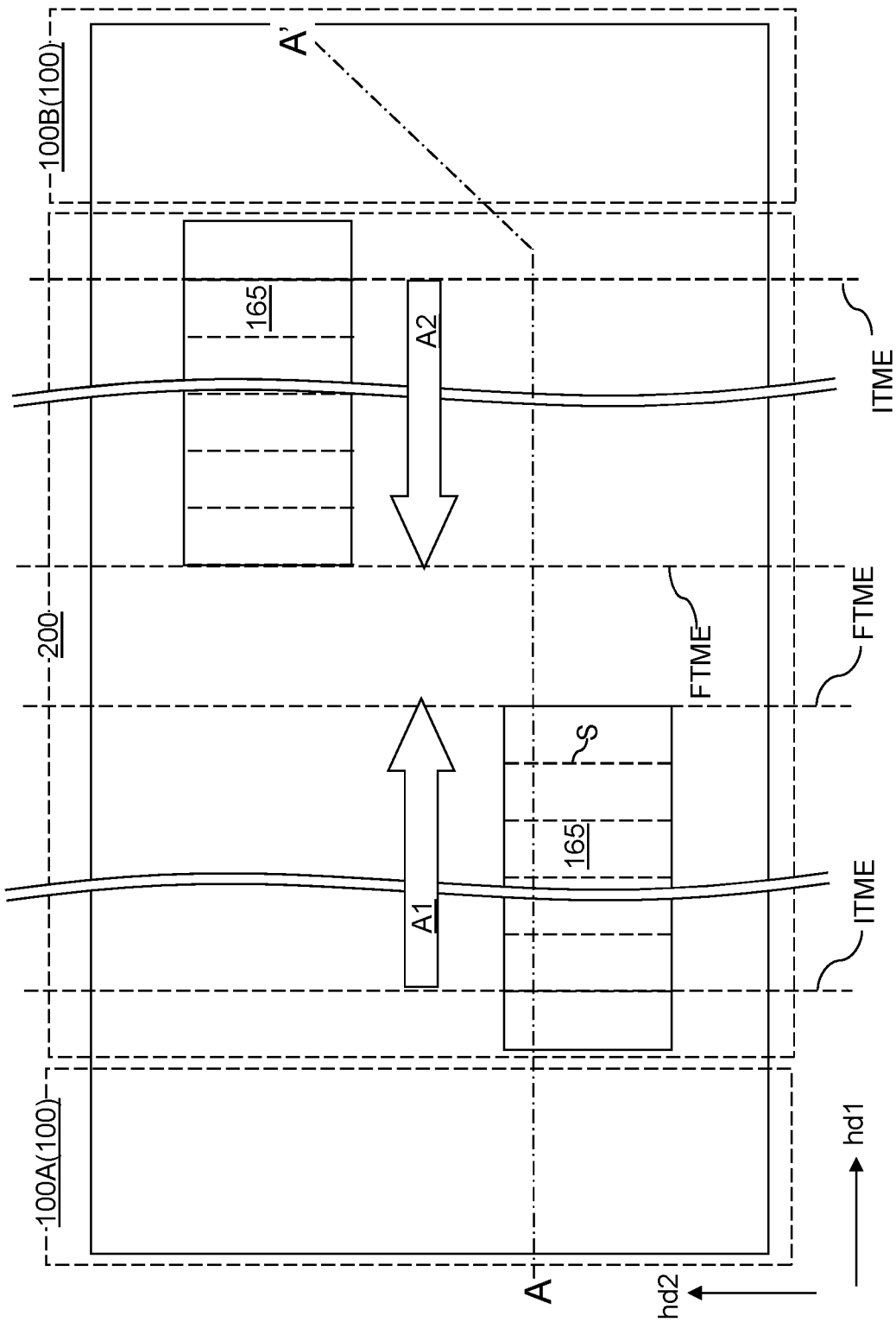
FIG. 3B is a top-down view of the exemplary structure of FIG. 3A. The hinged vertical plane A-A' is the plane of the vertical cross-sectional view of FIG. 3A.

Referring to FIGS. 3A and 3B, first stepped surfaces can be formed within the inter-array region 200 simultaneously. A hard mask layer (not shown) such as a metallic or dielectric mask material layer can be formed over the first vertically alternating sequence, and can be patterned to form multiple rectangular openings. The areas of openings within the hard mask layer correspond to areas in which first stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd2, and may be alternately staggered along the first horizontal direction hd1. Thus, upon sequentially numbering the rectangular openings along the second horizontal direction hd2, every odd-numbered rectangular openings through the hard mask layer can be formed as a first one-dimensional array arranged along the second horizontal direction hd2 aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the first vertically alternating sequence. The trimmable mask layer can include a trimmable photoresist layer that can be controllably trimmed by a timed ashing process. The trimmable mask layer can be patterned with an initial pattern such that a segment of each rectangular opening in the hard mask layer that is most proximal to the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step S of respective first stepped surfaces that is most proximal to one of the memory array regions 100. Locations of the initial trimmable mask edges ITME of the trimmable mask layer are marked with dotted lines.

The first stepped surfaces can be formed within the rectangular openings in the hard mask layer by iteratively performing a set of layer patterning processing steps as many times as the total number of first spacer material layers within the first vertically alternating sequence less 1. The set of layer patterning processing steps comprises an anisotropic etch process that etches unmasked portions of a pair of a first insulating layer 132 and a first spacer material layer (such as first sacrificial material layer 142), and a mask trimming process in which the trimmable mask layer is isotropically trimmed to provide shifted sidewalls that are shifted away from the most proximal memory array region 100. Locations of the final trimmable mask edges FTME of the trimmable mask layer are marked with dotted lines. The general directions of movement of edges of the trimmable mask layer are represented by arrows A1 and A2. A final anisotropic etch process can be performed after the last mask trimming process, and the trimmable mask layer can be removed, for example, by ashing. The hard mask layer can be removed selective to the materials of the first vertically alternating sequence (132, 142), for example, by an isotropic etch process (such as a wet etch process).

A first stepped cavity 163 can be formed within each area of the rectangular opening in the hard mask layer. Each first stepped cavity 163 can include a cliff region in which a tapered sidewall of the first vertically alternating sequence vertically extends from the bottommost layer of the first vertically alternating sequence (132, 142) to the topmost layer of the first vertically alternating sequence (132, 142). Each first stepped cavity 163 has respective first stepped surfaces as stepped bottom surfaces. Each first stepped cavity 163 has a pair of stepped sidewalls that laterally extend along the first horizontal direction hd1. Each stepped sidewall of the first stepped cavity adjoins the first stepped surfaces at the bottom edge, and extends to the top surface of the topmost layer of the first vertically alternating sequence (132, 142).

The array of first staircase regions can be arranged along the second horizontal direction hd2 with an alternating lateral offsets along the first horizontal direction hd1 to provide a staggered configuration for the first staircase regions. In other words, upon sequentially numerically labeling the first staircase regions with positive integers starting with 1 along the second horizontal direction hd2, every odd-numbered first staircase region may be closer to the first memory array region 100A than to the second memory array region 100B, and every even-numbered first staircase region may be closer to the second memory array region 100B than to the second memory array region 100A.

Figure 4A:
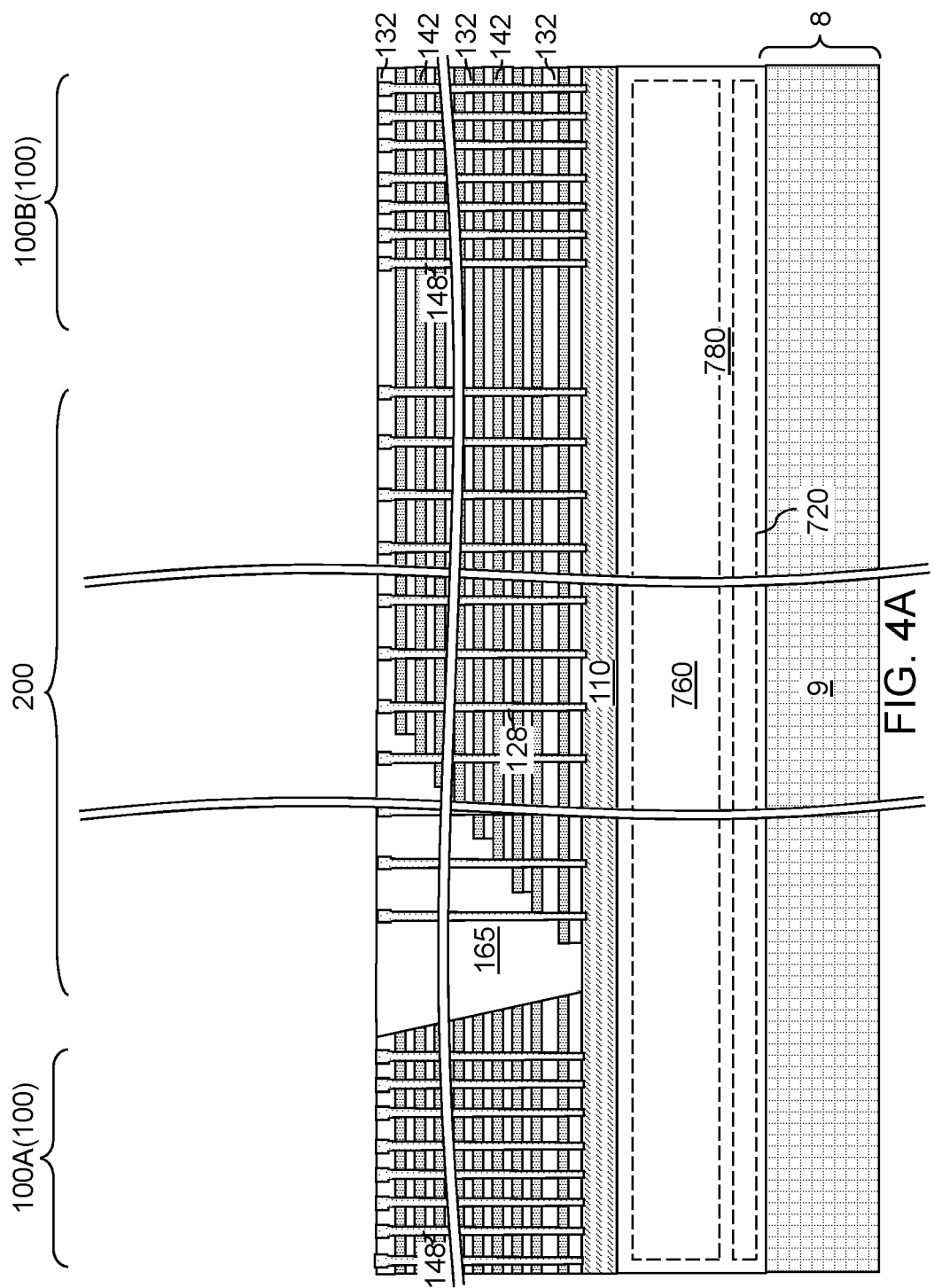
FIG. 4A is a vertical cross-sectional view of the exemplary structure after formation of first-tier retro-stepped dielectric material portions, first-tier openings, and sacrificial first-tier opening fill portions according to an embodiment of the present disclosure.
Figure 4B:
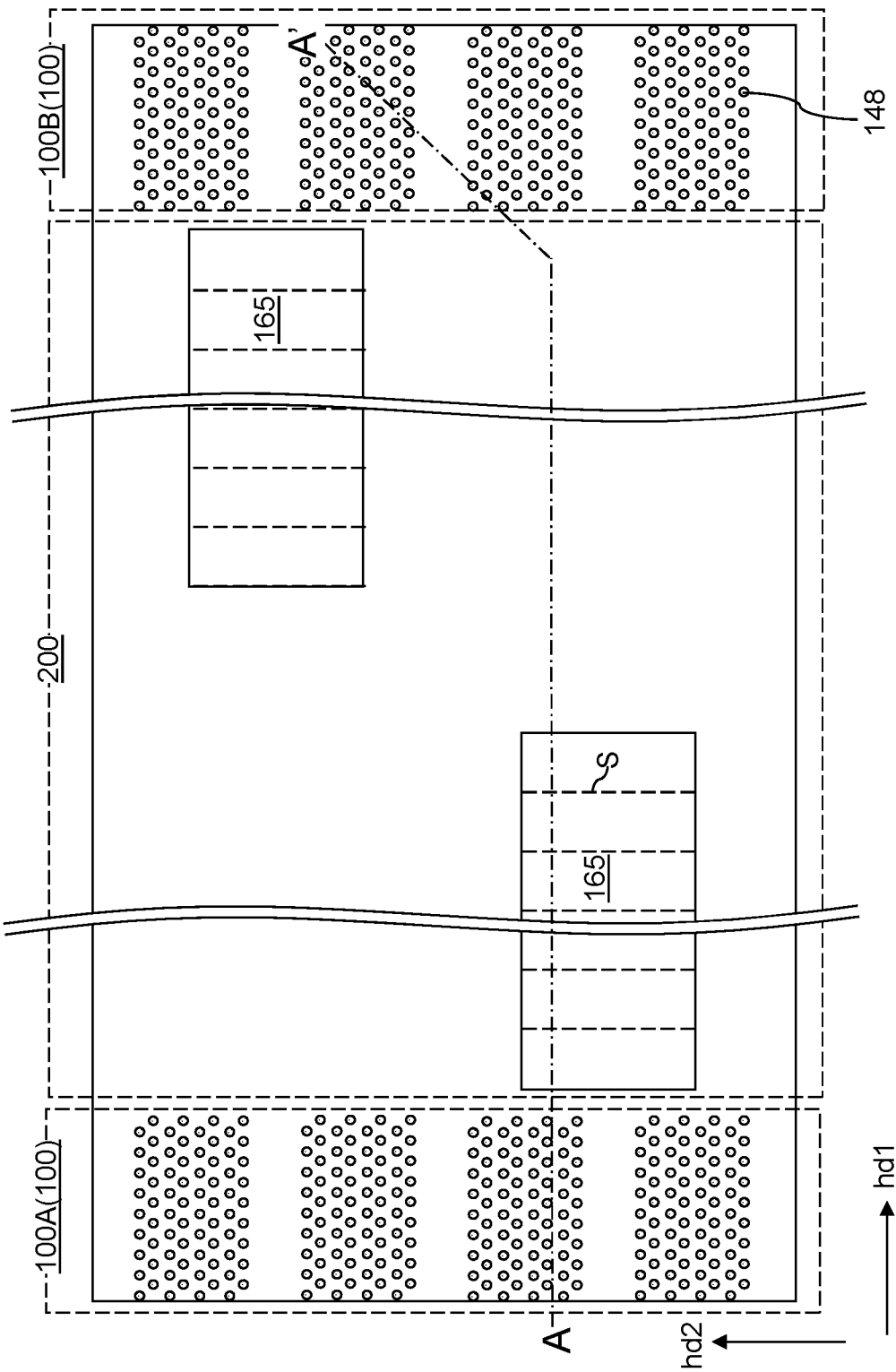
FIG. 4B is a top-down view of the exemplary structure of FIG. 4A. The hinged vertical plane A-A' is the plane of the vertical cross-sectional view of FIG. 4A.

Referring to FIGS. 4A and 4B, a first dielectric fill material (such as undoped silicate glass (i.e., silicon oxide) or a doped silicate glass) can be deposited in each first stepped cavity 163. The first dielectric fill material can be planarized to remove excess portions of the first dielectric fill material from above the horizontal plane including the topmost surface of the first vertically alternating sequence (132, 142). Each remaining portion of the first dielectric fill material that fills a respective first stepped cavity constitutes a first-tier retro-stepped dielectric material portion 165.

Various first-tier openings may be formed through the first vertically alternating sequence (132, 142) and into the semiconductor material layer 110. A photoresist layer (not shown) may be applied over the first vertically alternating sequence (132, 142), and may be lithographically patterned to form various openings therethrough. The pattern of openings in the photoresist layer may be transferred through the first vertically alternating sequence (132, 142) and into the semiconductor material layer 110 by a first anisotropic etch process to form the various first-tier openings concurrently, i.e., during the first isotropic etch process. The various first-tier openings may include first-tier memory openings formed in the memory array regions 100 and first-tier support openings formed in the inter-array region 200. Each cluster of first-tier memory openings may be formed as a two-dimensional array of first-tier memory openings. The first-tier support openings are openings that are formed in the inter-array region 200, and are subsequently employed to form support pillar structures. A subset of the first-tier support openings may be formed through a respective horizontal surface of the first stepped surfaces.

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first vertically alternating sequence (132, 142), such as from above the topmost first insulating layer 132. For example, the sacrificial first-tier fill material may be recessed to a top surface of the topmost first insulating layer 132 using a planarization process. The planarization process may include a recess etch, chemical mechanical planarization (CMP), or a combination thereof. The top surface of the topmost first insulating layer 132 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the topmost first insulating layer 132). The top surfaces of the sacrificial first-tier opening fill portions (148, 128) may be coplanar with the top surface of the topmost first insulating layer 132. Each of the sacrificial first-tier opening fill portions (148, 128) may, or may not, include cavities therein. The set of all structures located between the bottommost surface of the first vertically alternating sequence (132, 142) and the topmost surface of the first vertically alternating sequence (132, 142) or embedded within the first vertically alternating sequence (132, 142) constitutes a first-tier structure.

Figure 5:
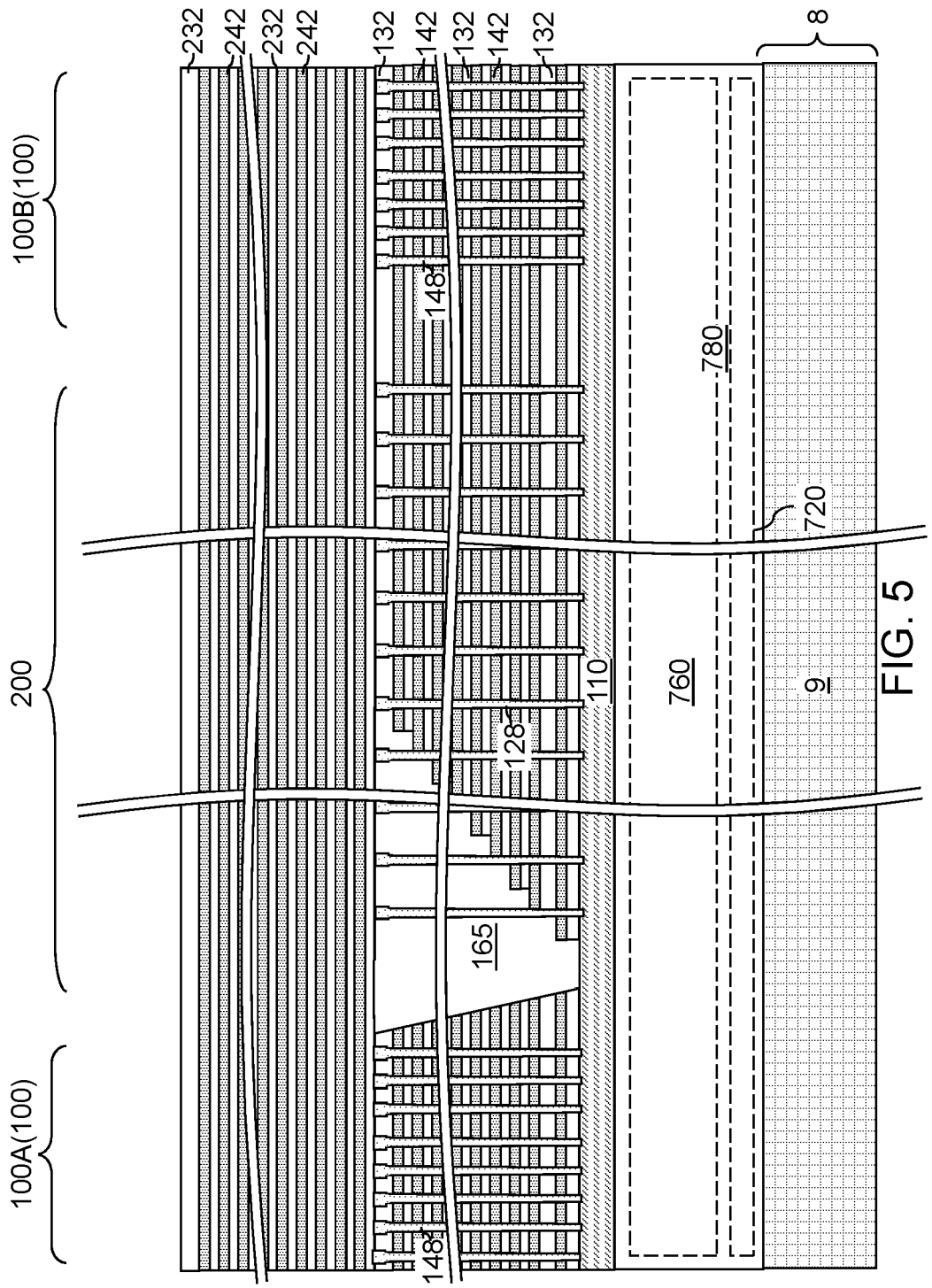
FIG. 5 is a vertical cross-sectional view of the exemplary structure after formation of a second vertically alternating sequence of second insulating layers and second spacer material layers according to an embodiment of the present disclosure.

Referring to FIG. 5, a second vertically alternating sequence of second insulating layers 232 and second spacer material layers can be formed. The second spacer material layers can be formed as second electrically conductive layers, or as second sacrificial material layers 242 that are subsequently replaced with second electrically conductive layers. The second insulating layers 232 can have the same material composition and the same thickness as the first insulating layers 132. The second spacer material layers can have the same material composition and the same thickness as the second spacer material layers.

Generally, at least one additional vertically alternating sequence of additional insulating layers and additional spacer material layers can be optionally formed over the first vertically alternating sequence (132, 142) and the first-tier retro-stepped dielectric material portions 165. The additional spacer material layers can be formed as, or are subsequently replaced with, additional electrically conductive layers.

Figure 6B:
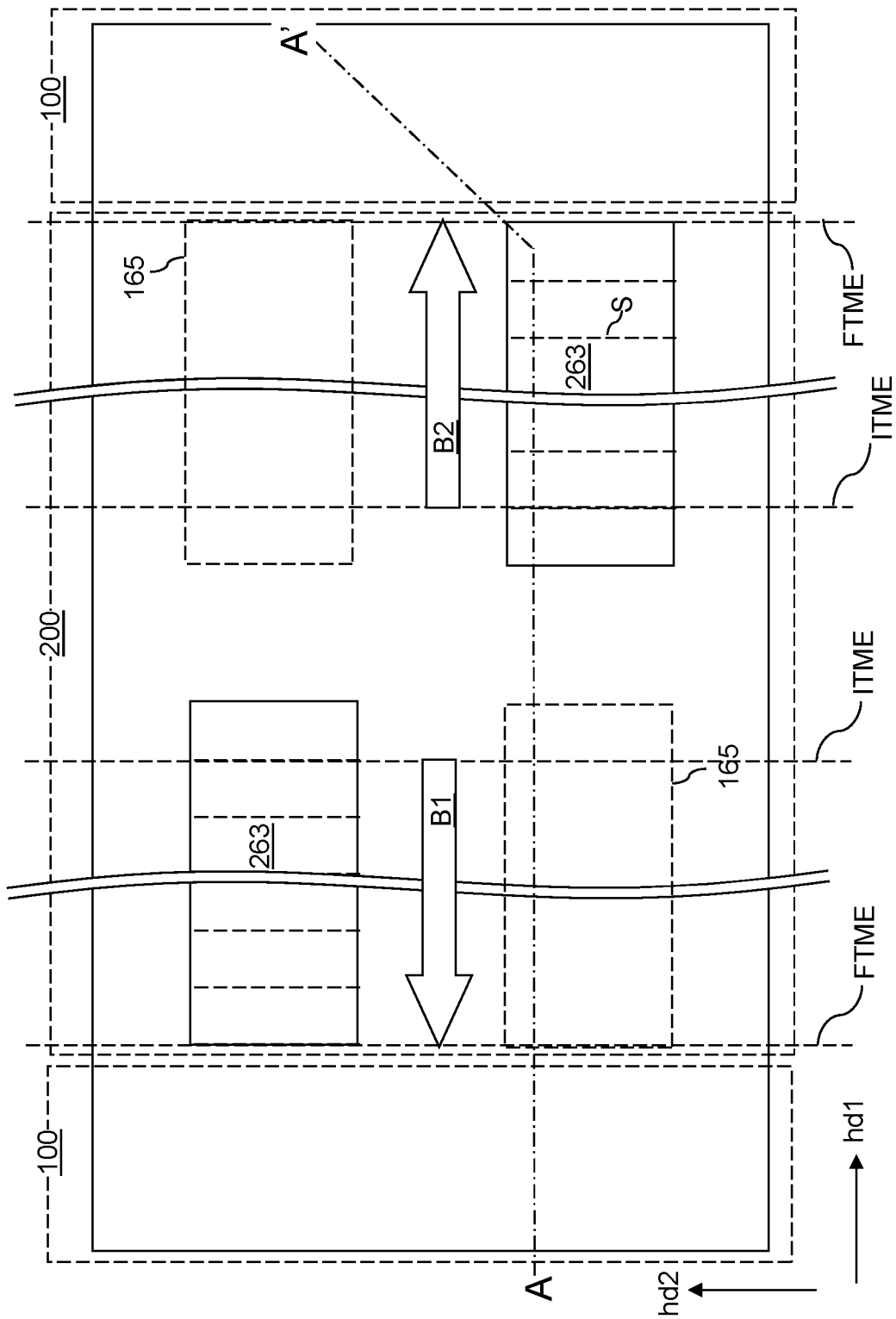
FIG. 6B is a top-down view of the exemplary structure of FIG. 6A. The hinged vertical plane A-A' is the plane of the vertical cross-sectional view of FIG. 6A.

Referring to FIGS. 6A and 6B, second stepped surfaces can be formed within the inter-array region 200 simultaneously. The areas of the second stepped surfaces are laterally offset from respective proximal first stepped surfaces along the first horizontal direction hd1 so that a set of first stepped surfaces and a set of second stepped surfaces that are laterally spaced along the first horizontal direction hd1 and are not offset along the second horizontal direction hd2 can provide a continuously ascending staircase or a continuously descending staircase. For example, a hard mask layer (not shown) such as a metallic or dielectric mask material layer can be formed over the second vertically alternating sequence, and can be patterned to form multiple rectangular openings that are laterally offset from a respective first-tier retro-stepped dielectric material portion 165 along the first horizontal direction hd1 and are aligned to (i.e., not laterally offset from) the respective first-tier retro-stepped dielectric material portion 165 along the second horizontal direction hd2. The areas of openings within the hard mask layer correspond to areas in which second stepped surfaces are to be subsequently formed. Each opening through the hard mask layer may be rectangular, and may have a pair of sides that are parallel to the first horizontal direction hd1 and a pair of sides that are parallel to the second horizontal direction hd2. The rectangular openings through the hard mask layer may be arranged along the second horizontal direction hd1, and may be alternately staggered along the second horizontal direction hd2. Thus, upon sequentially numbering the rectangular openings along the second horizontal direction hd2, every odd-numbered rectangular opening through the hard mask layer can be formed as a first one-dimensional array arranged along the second horizontal direction hd2 and aligned along the first horizontal direction hd1 (i.e., having a same lateral extent along the first horizontal direction), and every even-numbered rectangular openings through the hard mask layer can be formed as a second one-dimensional array arranged along the second horizontal direction hd2 aligned along the first horizontal direction hd1.

A trimmable mask layer (not shown) can be applied over the second vertically alternating sequence. The trimmable mask layer can include a trimmable photoresist layer that can be controllably trimmed by a timed ashing process. The trimmable mask layer can be patterned with an initial pattern such that a segment of each rectangular opening in the hard mask layer that is most distal from the memory array regions 100 is not masked by the trimmable mask layer, while the rest of each rectangular opening is covered by the trimmable mask layer. For example, the trimmable mask layer can have a rectangular shape having straight edges that are parallel to the second horizontal direction hd2, such that the straight edges are located over a vertical step S of respective second stepped surfaces that is most distal from one of the memory array regions 100. Locations of the initial trimmable mask edges ITME of the trimmable mask layer are marked with dotted lines.

The second stepped surfaces can be formed within the rectangular openings in the hard mask layer by iteratively performing a set of layer patterning processing steps as many times as the total number of second spacer material layers within the second vertically alternating sequence less 1. The set of layer patterning processing steps comprises an anisotropic etch process that etches unmasked portions of a pair of a second insulating layer 232 and a second spacer material layer (such as second sacrificial material layer 242), and a mask trimming process in which the trimmable mask layer is isotropically trimmed to provide shifted sidewalls that are shifted away from the most proximal memory array region 100. Locations of the final trimmable mask edges FTME of the trimmable mask layer are marked with dotted lines. The general directions of movement of edges of the trimmable mask layer are represented by arrows B1 and B2. A final anisotropic etch process can be performed after the last mask trimming process, and the trimmable mask layer can be removed, for example, by ashing. The hard mask layer can be removed selective to the materials of the second vertically alternating sequence (132, 142), for example, by an isotropic etch process (such as a wet etch process).

A second stepped cavity 263 can be formed within each area of the rectangular opening in the hard mask layer. Each second stepped cavity 263 can include a cliff region in which a tapered sidewall of the second vertically alternating sequence vertically extends from the bottommost layer of the second vertically alternating sequence (232, 242) to the topmost layer of the second vertically alternating sequence (232, 242). Each second stepped cavity 263 has respective second stepped surfaces as stepped bottom surfaces. Each second stepped cavity 263 has a pair of stepped sidewalls that laterally extend along the first horizontal direction hd1. Each stepped sidewall of the second stepped cavity 263 adjoins the second stepped surfaces at the bottom edge, and extends to the top surface of the topmost layer of the second vertically alternating sequence (232, 242). Each second stepped cavity 263 defines the lateral extent of respective second stepped surfaces.

The array of second staircase regions can be arranged along the second horizontal direction hd2 with an alternating lateral offsets along the first horizontal direction hd1 to provide a staggered configuration for the second staircase regions. In other words, upon sequentially numerically labeling the second staircase regions with positive integers starting with 1 along the second horizontal direction hd2, every even-numbered second staircase region may be closer to the second memory array region 100A than to the second memory array region 100B, and every odd-numbered second staircase region may be closer to the second memory array region 100B than to the second memory array region 100A. The second stepped cavities can be first openings that extend through each layer within the second vertically alternating sequence (232, 242).

Figure 7B:
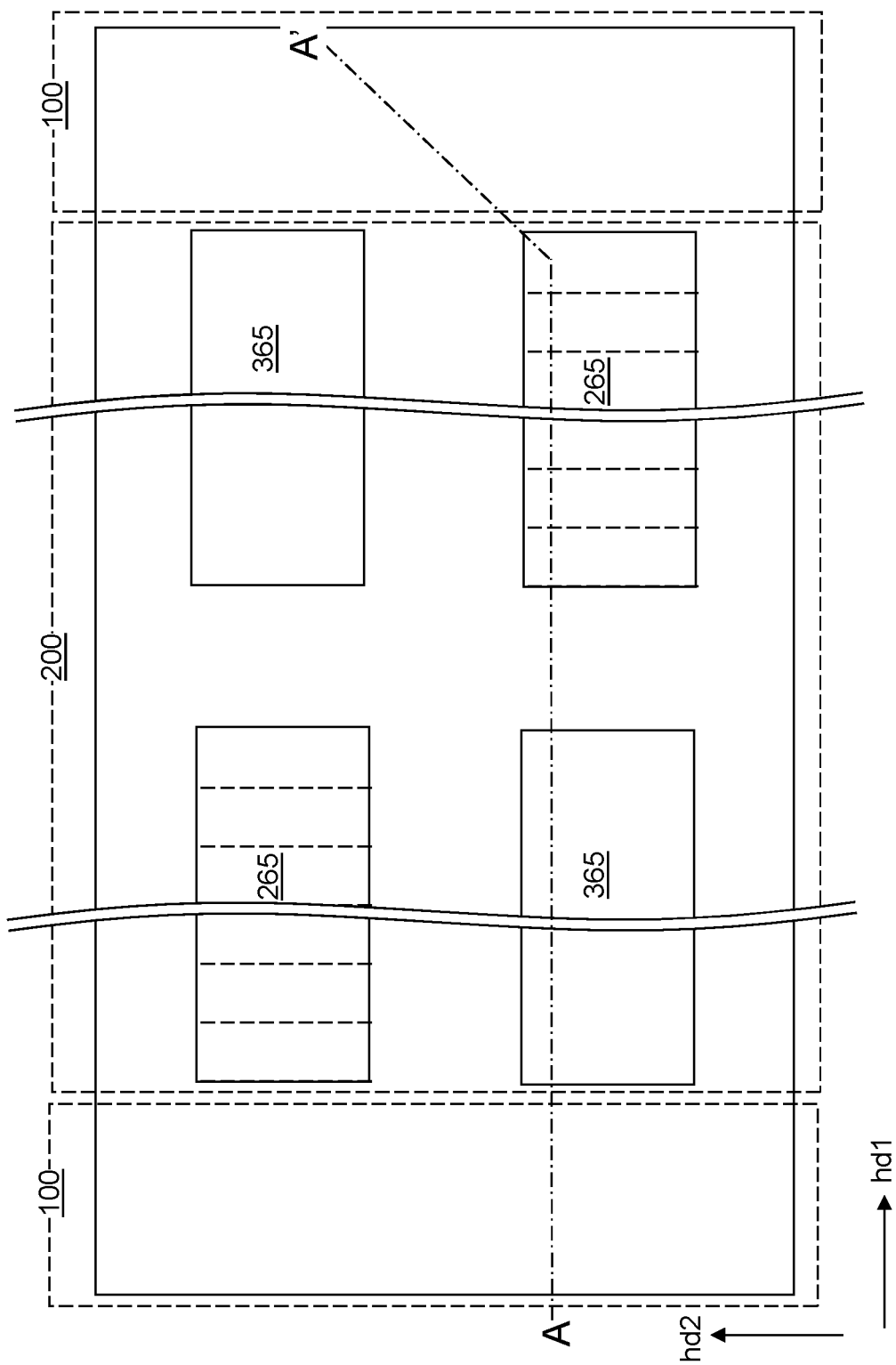
FIG. 7B is a top-down view of the exemplary structure of FIG. 7A. The hinged vertical plane A-A' is the plane of the vertical cross-sectional view of FIG. 7A.

Referring to FIGS. 7A and 7B, a photoresist layer can be applied over the second vertically alternating sequence (232, 242) and the second stepped cavities 263, and can be lithographically patterned to form openings in the regions that overlie the first-tier retro-stepped dielectric material portions 165 and do not overlap with the second stepped cavities 263. In one embodiment, the edges of the openings in the photoresist layer may coincide with, or may be laterally offset from, edges of the top surface of a respective underlying first-tier retro-stepped dielectric material portion 165. In one embodiment, the edges of the openings in the photoresist layer can be positioned such that the bottom periphery of each opening (which are also referred to as a well) to be subsequently formed through the second vertically alternating sequence (232, 242) is located entirely within a periphery of the top surface of a respective one of the first-tier retro-stepped dielectric material portions 165.

An anisotropic etch process can be performed employing the photoresist layer as an etch mask. Unmasked portions of the second vertically alternating sequence (232, 242) are etched by the anisotropic etch process, and second openings are formed in the vertically alternating sequence (232, 242). The second openings are herein referred to wells. Each well can be formed over a respective one of the first-tier retro-stepped dielectric material portion 165, and a top surface of the first-tier retro-stepped dielectric material portion 165 is physically exposed at the bottom of each well. Each well is a second opening through the second vertically alternating sequence (232, 242), and is laterally offset from the second stepped cavities 263 which are first openings through the second vertically alternating sequence (232, 242). In one embodiment, each well can be aligned along the second horizontal direction hd2 to a respective second stepped cavity 263, and can be laterally spaced from the respective second stepped cavity 263 along the first horizontal direction hd1 by a strip portion of the second vertically alternating sequence (232, 242) extending along the second horizontal direction hd2. A bottom periphery of each well can be laterally offset inward from the top periphery of the top surface of a respective underlying first-tier retro-stepped dielectric material portion 165.

A second dielectric fill material (such as undoped silicate glass or a doped silicate glass) can be deposited in each second stepped cavity 263 and in each well. The second dielectric fill material can be planarized to remove excess portions of the second dielectric fill material from above the horizontal plane including the topmost surface of the second vertically alternating sequence (232, 242). Each remaining portion of the second dielectric fill material that fills a respective second stepped cavity 263 constitutes a second-tier retro-stepped dielectric material portion 265. Each remaining portion of the second dielectric fill material that fills a respective well constitutes a dielectric well structure 365. Thus, the second-tier retro-stepped dielectric material portions 265 are formed in the first openings through the second vertically alternating sequence (232, 242), and dielectric well structures 365 are formed in the second openings through the second vertically alternating sequence (232, 242). Each dielectric well structure 365 is formed through the second vertically alternating sequence (232, 242) on a top surface of a respective first-tier retro-stepped dielectric material portion 165. Each dielectric well structure 365 is laterally spaced from a second-tier retro-stepped dielectric material portion 265 by a patterned portion of the second vertically alternating sequence (232, 242).

Figure 8:
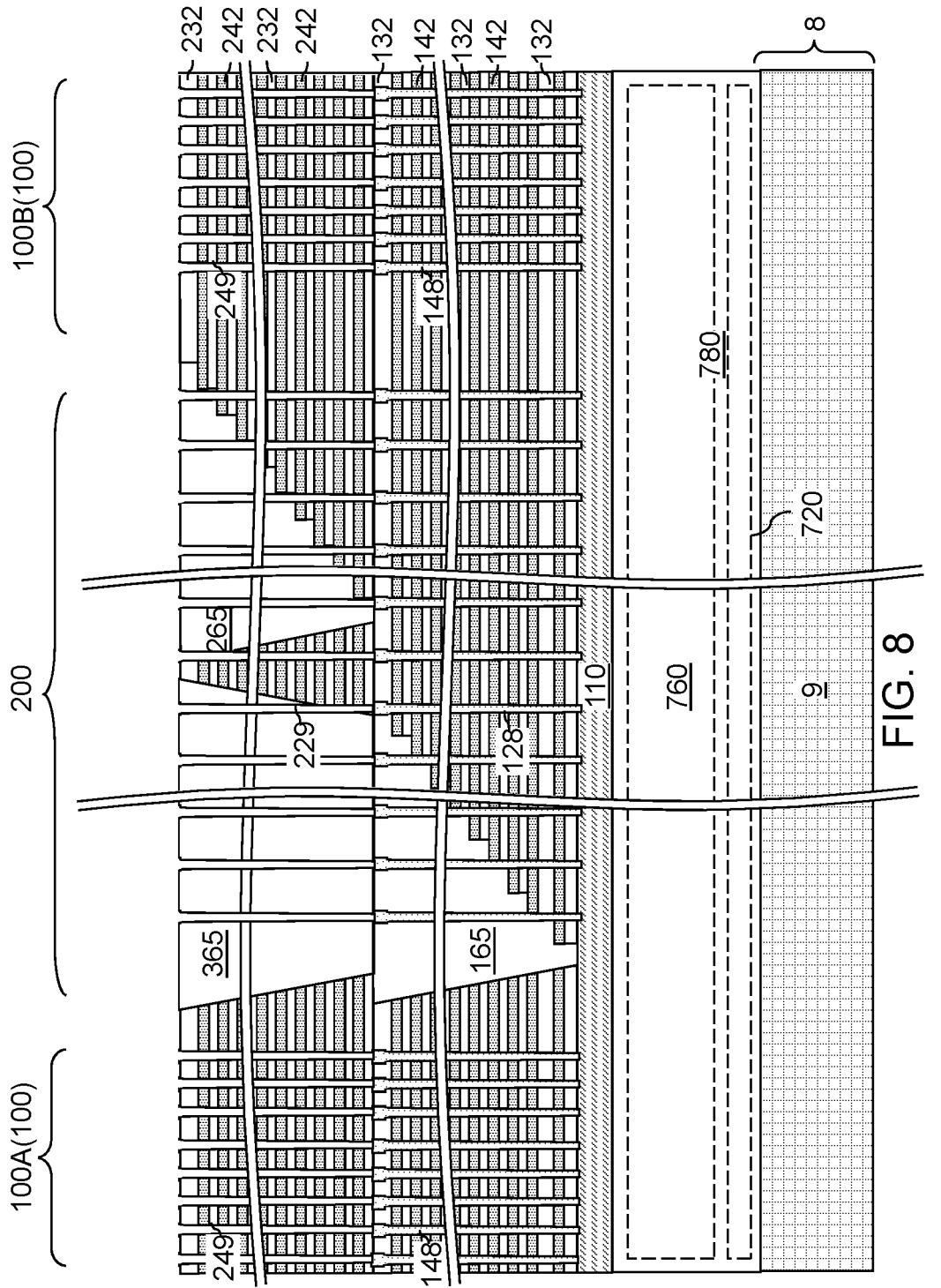
FIG. 8 is a vertical cross-sectional view of the exemplary structure after formation of second-tier openings according to an embodiment of the present disclosure.

Referring to FIG. 8, various second-tier openings (249, 229) may be formed through the second vertically alternating sequence (132, 142) and over the sacrificial first-tier opening fill portions (148, 128). A photoresist layer (not shown) may be applied over the second vertically alternating sequence (232, 242), and may be lithographically patterned to form various openings therethrough. The pattern of openings in the photoresist layer may be transferred through the second vertically alternating sequence (232, 242) to form the various second-tier openings (249, 229) concurrently, i.e., during the second isotropic etch process.

The various second-tier openings (249, 229) may include second-tier memory openings 249 formed in the memory array regions 100 and second-tier support openings 229 formed in the inter-array region 200. Each second-tier opening (249, 229) may be formed within the area of a respective one of the sacrificial first-tier opening fill portions (148, 128). Thus, a top surface of a sacrificial first-tier opening fill portion (148, 128) can be physically exposed at the bottom of each second-tier opening (249, 229). Specifically, each second-tier memory openings 249 can be formed directly over a respective sacrificial first-tier memory opening fill portion 148, and each second-tier support opening 229 can be formed directly over a respective sacrificial first-tier support opening fill portion 128. Each cluster of second-tier memory openings 249 may be formed as a two-dimensional array of second-tier memory openings 249. The second-tier support openings 229 are openings that are formed in the inter-array region 200, and are subsequently employed to form support pillar structures. A subset of the second-tier support openings may be formed through a respective horizontal surface of the second stepped surfaces. The photoresist layer can be subsequently removed, for example, by ashing. The set of all structures located between the bottommost surface of the second vertically alternating sequence (232, 242) and the topmost surface of the second vertically alternating sequence (232, 242) or embedded within the second vertically alternating sequence (232, 242) constitutes a second-tier structure.

Referring to FIG. 9A, the sacrificial first-tier fill material of the sacrificial first-tier opening fill portions (148, 128) may be removed using an etch process that etches the sacrificial first-tier fill material selective to the materials of the first and second insulating layers (132, 232) and the first and second sacrificial material layers (142, 242). A memory opening, which is also referred to as an inter-tier memory opening 49, is formed in each combination of a second-tier memory openings and a volume from which a sacrificial first-tier memory opening fill portion 148 is removed. A support opening, which is also referred to as an inter-tier support opening, is formed in each combination of a second-tier support openings and a volume from which a sacrificial first-tier support opening fill portion 128 is removed. The inter-tier memory opening 49 extends through the first-tier structure and the second-tier structure. Generally, memory openings 49 can be formed within each memory array region 100, in which each layer of the first vertically alternating sequence (132, 142) and each layer within the second vertically alternating sequence (232, 242) are present.

Referring to FIG. 9B, a stack of layers including a blocking dielectric layer 52, a charge storage layer 54, a tunneling dielectric layer 56, and a semiconductor channel material layer 60L may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/\text{cm}^3$ to $1.0 \times 10^{18}/\text{cm}^3$, such as from $1.0 \times 10^{14}/\text{cm}^3$ to $1.0 \times 10^{17}/\text{cm}^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/\text{cm}^3$ to $1.0 \times 10^{18}/\text{cm}^3$, such as from $1.0 \times 10^{14}/\text{cm}^3$ to $1.0 \times 10^{17}/\text{cm}^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Figure 9C:
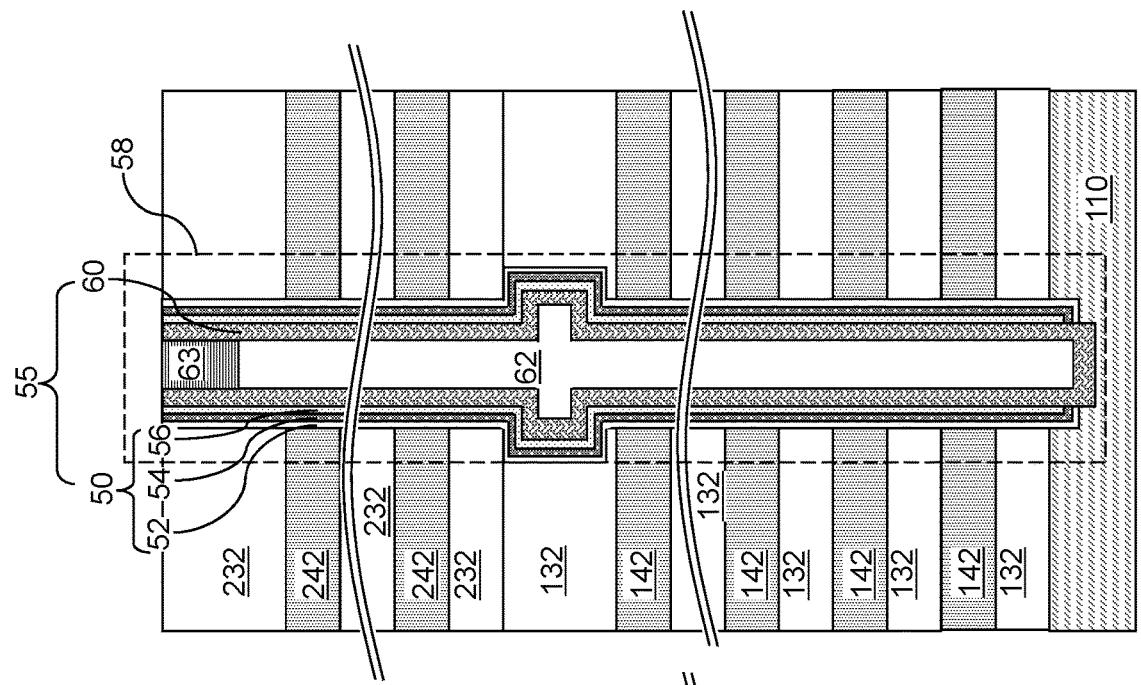

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second insulating layer 232 may be removed, for example, by a recess etch. The recess etch continues until top surfaces of the remaining portions of the dielectric core layer are recessed to a height between the top and bottom surfaces of the top second insulating cap layer 232. Each remaining portion of the dielectric core layer constitutes a dielectric core 62.

Figure 9D:
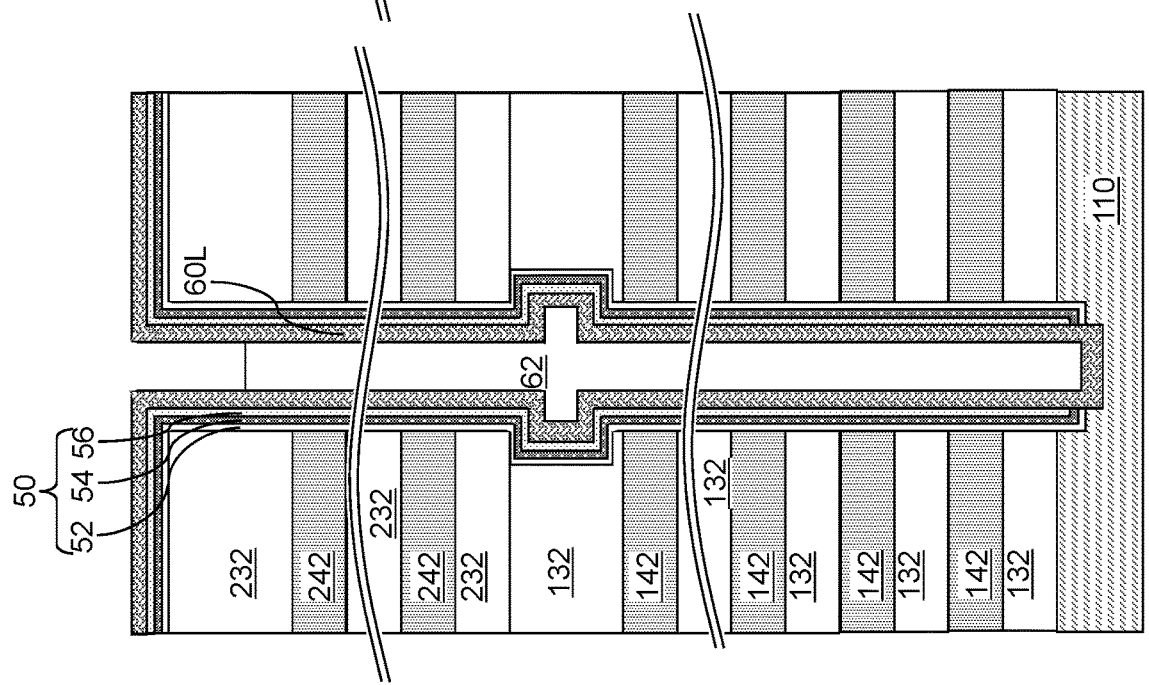
Figure 10:
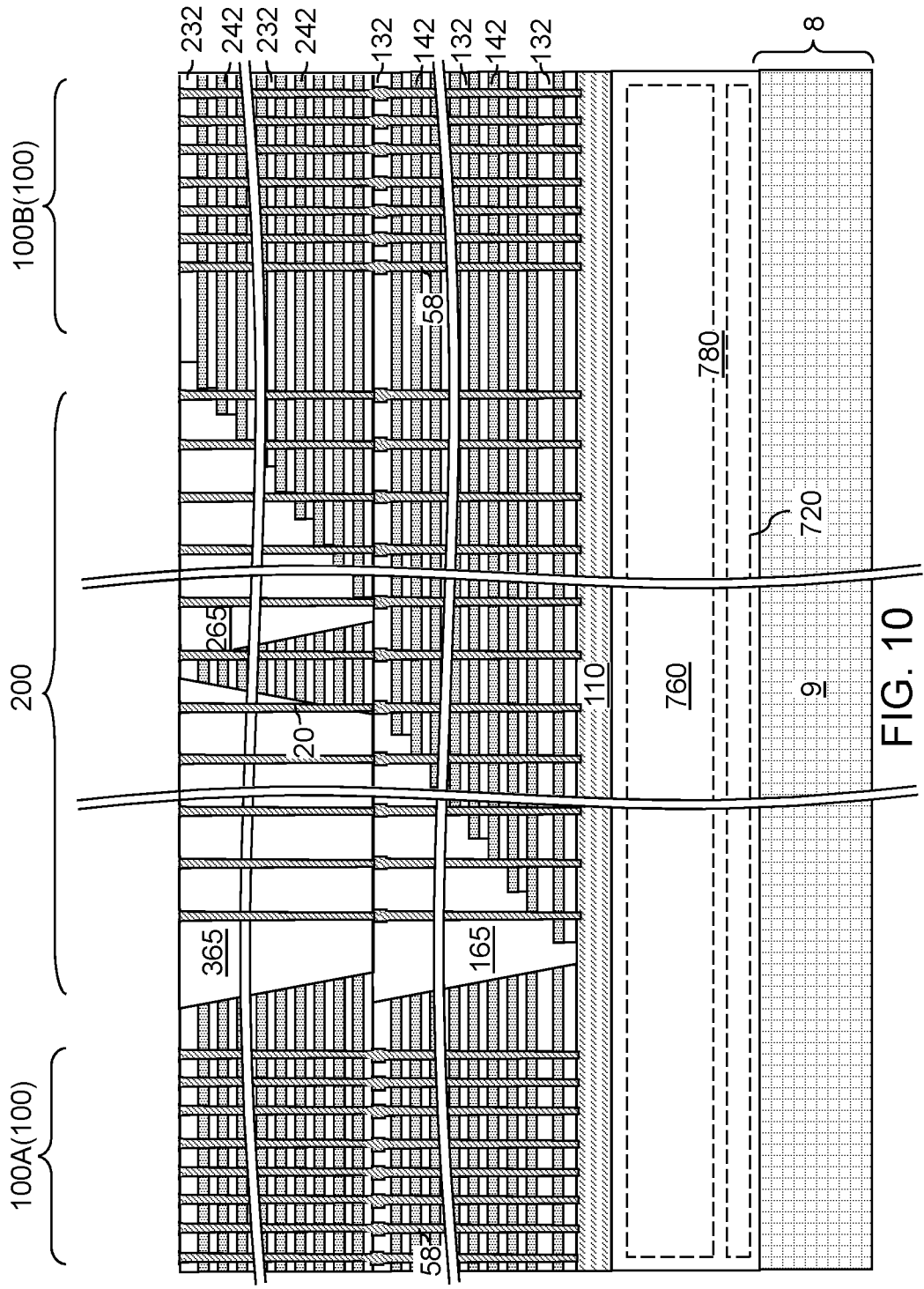
FIG. 10 is a vertical cross-sectional view of the exemplary structure after formation of memory opening fill structures and support pillar structures according to an embodiment of the present disclosure.

Referring to FIGS. 9D and 10, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the top second insulating layer 232 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/\text{cm}^3$ to $2.0 \times 10^{21}/\text{cm}^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

Each inter-tier support opening can be filled with a respective set of material portions having the same material composition as a corresponding component in a memory opening fill structure 58. Each set of material portions filling an inter-tier support opening is herein referred to as a support pillar structure 20. It is noted that memory opening fill structures 58 located in the memory array regions 100 are illustrated in FIGS. 1B-1E, and the support pillar structures 20 are not illustrated in FIGS. 1A-1G for the purpose of clarity. The semiconductor material layer 110, the first-tier structure (132, 142, 165), the second-tier structure (232, 242, 265), the memory opening fill structures 58, and the support pillar structures 20 collectively constitute a memory-level assembly.

Generally, the support pillar structures 20 are formed in the inter-array region 200. The support pillar structures 20 include first support pillar structures 20 that vertically extend through a dielectric well structure 365, a first-tier retro-stepped dielectric material portion 165, and a portion of the first-tier alternating stack (132, 142) that underlies the first-tier retro-stepped dielectric material portion 165, and include second support pillar structures 20 that vertically extend through a second-tier retro-stepped dielectric material portion 265, a portion of the second-tier alternating stack (232, 242) that underlies the second-tier retro-stepped dielectric material portion 265, and each layer within the first-tier alternating stack (132, 142).

Referring to FIG. 11, a contact-level dielectric layer 280 may be formed over the second vertically alternating sequence (232, 242). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

Figure 12A:
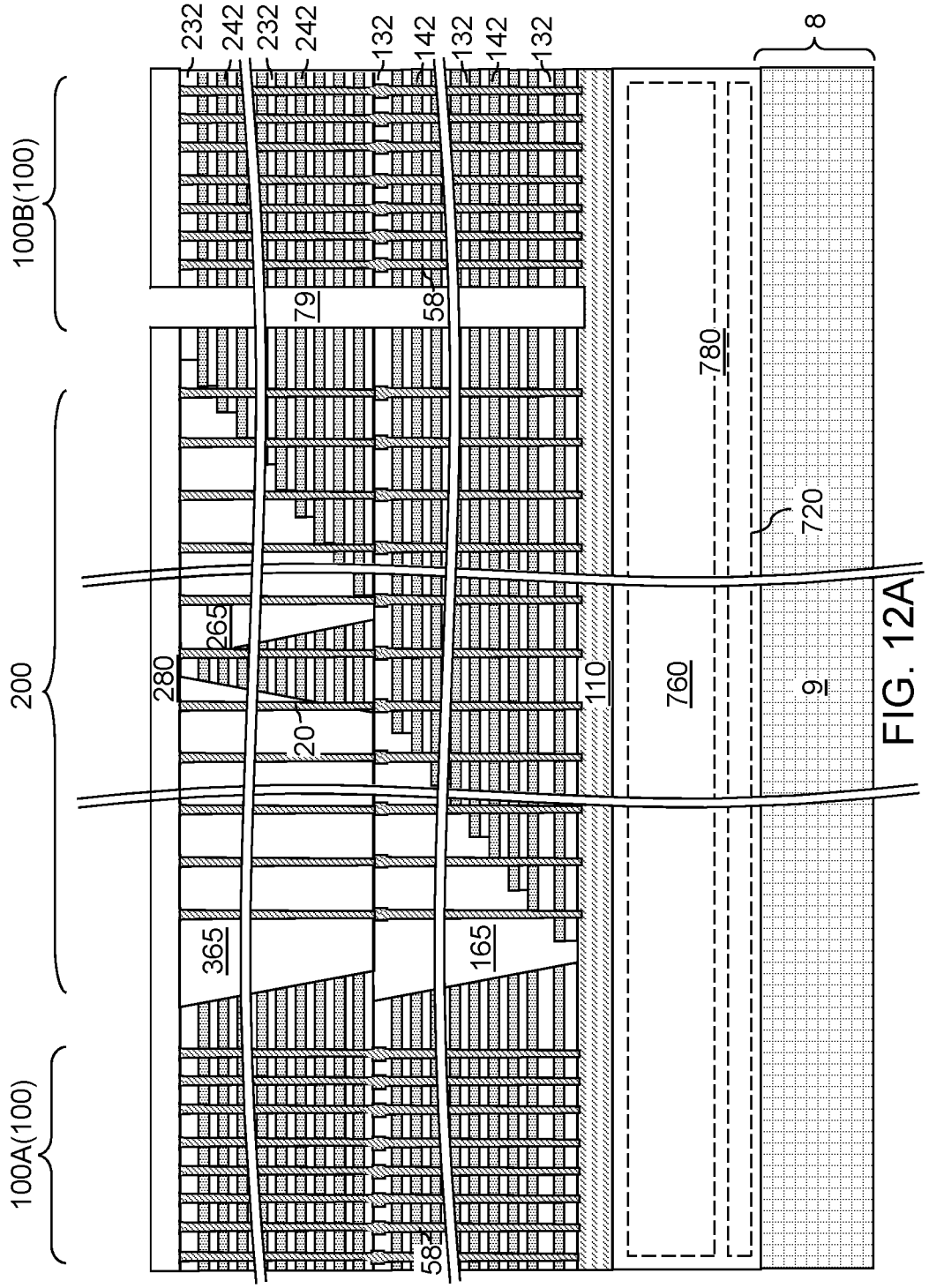
FIG. 12A is a vertical cross-sectional view of the exemplary structure after formation of backside trenches according to an embodiment of the present disclosure.
Figure 12B:
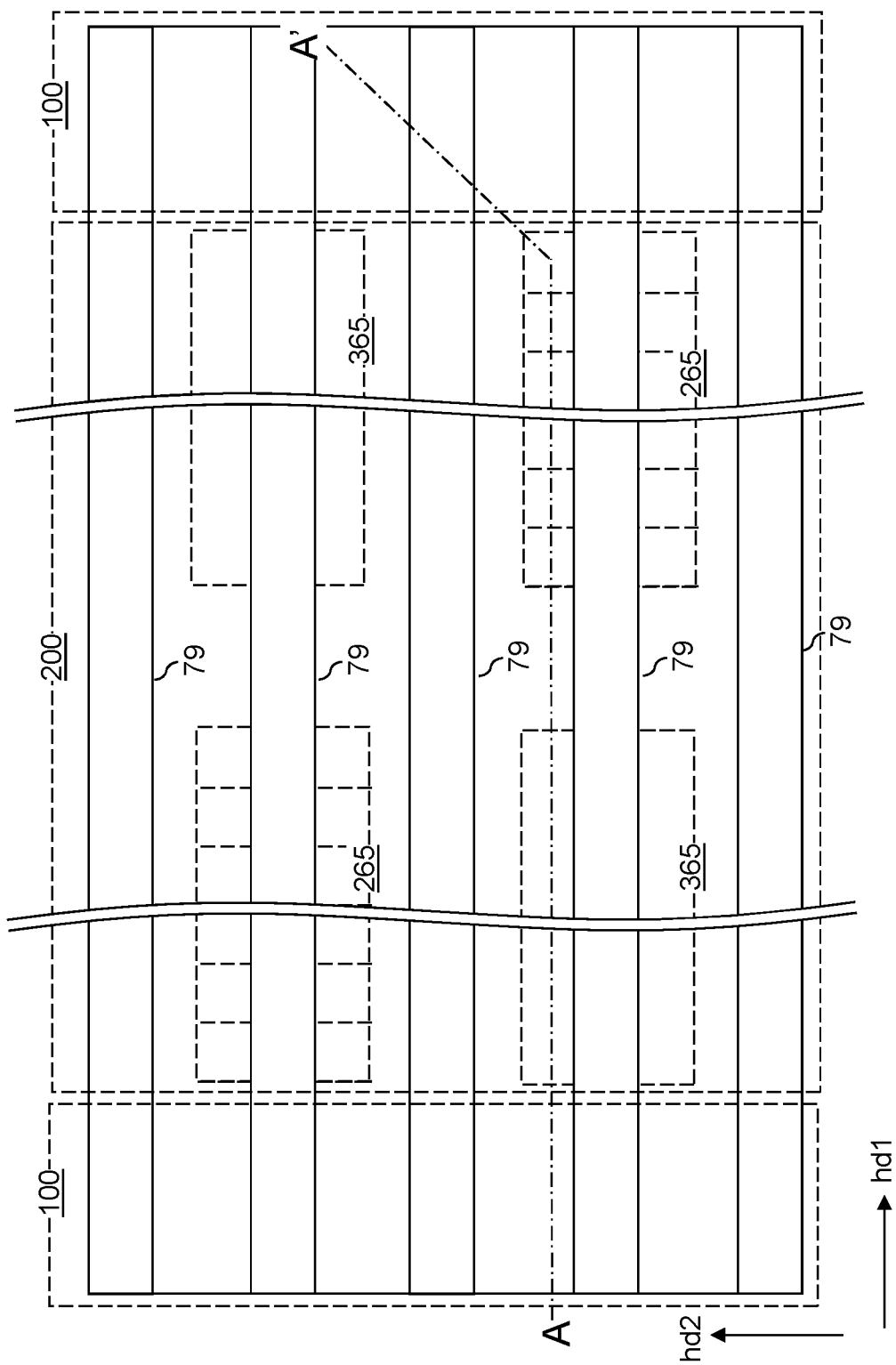
FIG. 12B is a top-down view of the exemplary structure of FIG. 12A. The hinged vertical plane A-A' is the plane of the vertical cross-sectional view of FIG. 12A.

Referring to FIGS. 12A and 12B, a photoresist layer (not shown) may be applied over the contact-level dielectric layer 280, and may be lithographically patterned to form linear openings laterally extending along the first horizontal direction hd1 and laterally spaced apart along the second horizontal direction hd2. The pattern of the linear openings in the photoresist layer can be identical to the pattern of the backside trench 79 fill structures 76 illustrated in FIGS. 1B-1G. The linear openings in the photoresist layer can be formed within areas in which memory opening fill structures 58 or the support pillar structures 20 are not present.

Backside trenches 79 be formed by transferring the pattern in the photoresist layer (not shown) through the contact-level dielectric layer 280, the second-tier structure (232, 242, 265, 365), and the first-tier structure (132, 142, 165), and into the semiconductor material layer 110. The pattern of the backside trenches 79 can be identical to the pattern of the backside trench 79 fill structures 76 illustrated in FIGS. 1B-1G. Portions of the contact-level dielectric layer 280, the second-tier structure (232, 242, 265, 365), the first-tier structure (132, 142, 165), and the semiconductor material layer 110 that underlie the linear openings in the photoresist layer may be removed by an anisotropic etch process to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The backside trenches 79 can be formed as a periodic one-dimensional array with a periodicity along the second horizontal direction hd2. The backside trenches 79 can be sequentially numerically numbered with positive integers from one side to another along the second horizontal direction hd2. In one embodiment, every odd-numbered backside trench 79 can extend through the second vertically alternating sequence (232, 242) and the first vertically alternating sequence (132, 142) without etching through the first-tier retro-stepped dielectric material portions 165, the second-tier retro-stepped dielectric material portions 265, and the dielectric well structures 365. Every even-numbered backside trench 79 can extend through the second vertically alternating sequence (232, 242) and the first vertically alternating sequence (132, 142) and cut through a respective first-tier retro-stepped dielectric material portion 165, a respective second-tier retro-stepped dielectric material portion 265, and a respective dielectric well structure 365.

Each vertically alternating sequence {(132, 142), (232, 242)} is divided into a plurality of alternating stacks of insulating layers (132 or 232) and spacer material layers (such as the sacrificial material layers (142, 242)) (e.g., memory blocks) by the backside trenches 79. Each backside trench 79 can laterally extend along the first horizontal direction hd1 through am inter-array region 200 and a pair of memory array regions 100 that are adjoined to inter-array region 200. Further, each backside trench 79 can vertically extend through an entire thickness of the vertically alternating sequences {(132, 142), (232, 242)}. Each patterned portion of the first vertically alternating sequence (132, 142) located between a neighboring pair of backside trenches 79 constitutes a first alternating stack of first insulating layers 132 and first spacer material layers (such as first sacrificial material layers 142). Each patterned portion of the second vertically alternating sequence located between a neighboring pair of backside trenches 79 constitutes a second alternating stack of second insulating layers 232 and second spacer material layers (such as second sacrificial material layers 242). A plurality of alternating stacks of insulating layers (132 or 232) and spacer material layers (which may be first sacrificial material layers 142 or second sacrificial material layers 242) can be formed.

Each first-tier retro-stepped dielectric material portion 165 is divided into two disjoined first-tier retro-stepped dielectric material portions 165 by a backside trench 79. Each second-tier retro-stepped dielectric material portion 265 is divided into two disjoined second-tier retro-stepped dielectric material portions 265 by a backside trench 79. Each dielectric well structure 365 is divided into two disjoined dielectric well structures 365 by a backside trench 79.

Figure 13A:
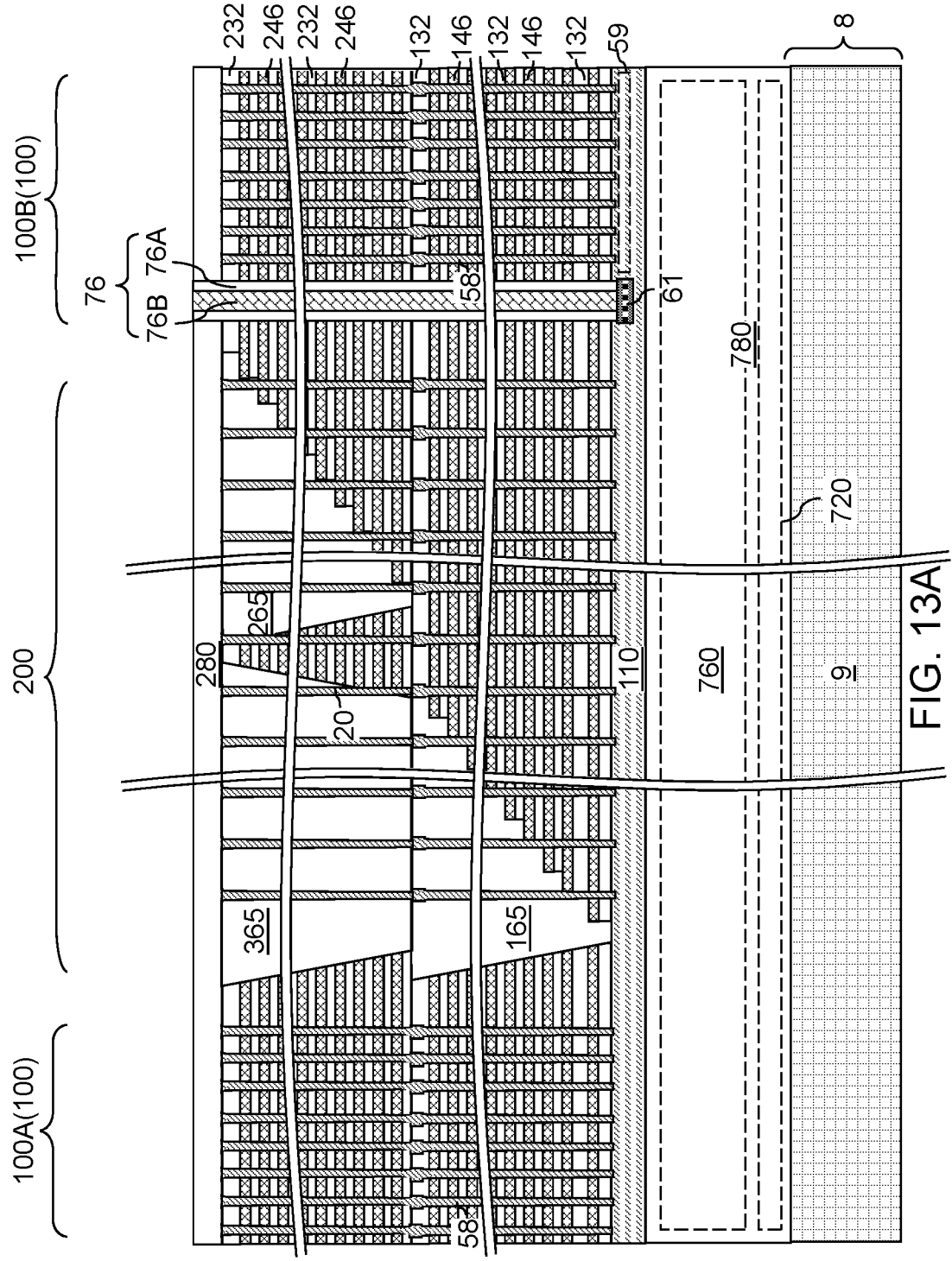
FIG. 13A is a vertical cross-sectional view of the exemplary structure after formation of electrically conductive layers and backside trench fill structures according to an embodiment of the present disclosure.
Figure 13B:
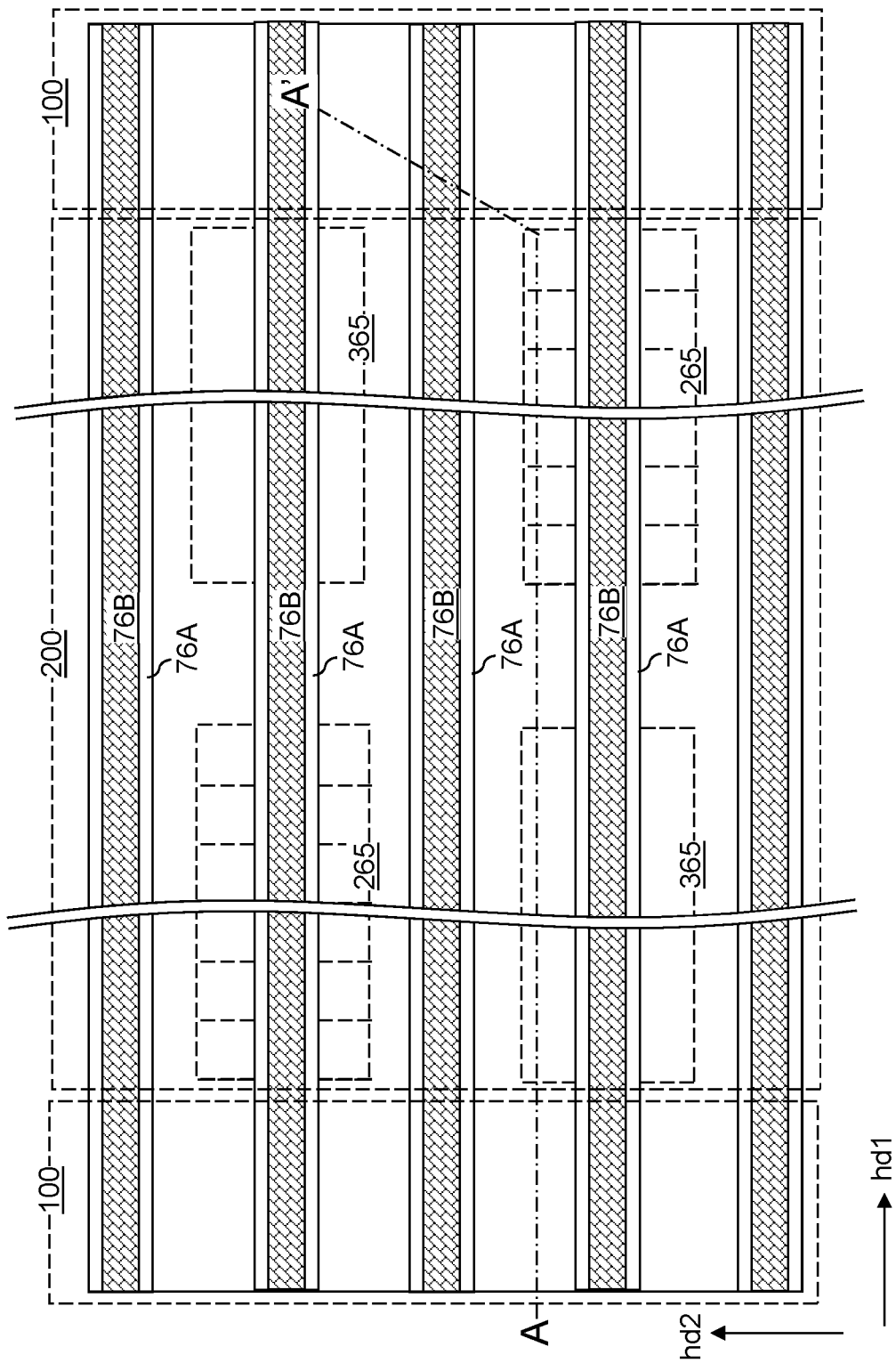
FIG. 13B is a top-down view of the exemplary structure of FIG. 13A. The hinged vertical plane A-A' is the plane of the vertical cross-sectional view of FIG. 13A.

Referring to FIGS. 13A and 13B, if the spacer material layers comprise sacrificial material layers (142, 242), then the sacrificial material layers (142, 242) are removed selective to the insulating layers (132, 232), the contact-level dielectric layer 280, and the semiconductor material layer 110. For example, an etchant that selectively etches the materials of the sacrificial material layers (142, 242) with respect to the materials of the insulating layers (132, 232), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses are formed in volumes from which the sacrificial material layers (142, 242) are removed. The backside recesses include first backside recesses that are formed in volumes from which the first sacrificial material layers 142 are removed and second backside recesses that are formed in volumes from which the second sacrificial material layers 242 are removed. Each of the backside recesses may be a laterally extending cavity having a lateral dimension that is greater than the vertical extent of the cavity. In other words, the lateral dimension of each of the backside recesses may be greater than the height of the respective backside recess. A plurality of backside recesses may be formed in the volumes from which the material of the sacrificial material layers (142, 242) is removed. Each of the backside recesses may extend substantially parallel to the top surface of the substrate semiconductor layer 9. A backside recess may be vertically bounded by a top surface of an underlying insulating layer (132, 232) and a bottom surface of an overlying insulating layer (132, 232). In one embodiment, each of the backside recesses may have a uniform height throughout.

An optional backside blocking dielectric layer (not shown) may be optionally deposited in the backside recesses and the backside trenches 79 and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses, on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material.

Electrically conductive layers (146, 246) may be formed in the backside recesses by deposition of the at least one conductive material. A plurality of first electrically conductive layers 146 may be formed in the plurality of first backside recesses, a plurality of second electrically conductive layers 246 may be formed in the plurality of second backside recesses, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

In one embodiment, the semiconductor material layer 110 can have a doping of the same conductivity type as the vertical semiconductor channels 60, i.e., a first conductivity type, and a source region 61 having a doping of a second conductivity type (which is the same conductivity type as the doping of the drain regions 63) can be formed underneath each backside trench 79 by implantation of dopants of the second conductivity type. A dielectric liner including a dielectric material (such as silicon oxide) can be conformally deposited at a periphery of each backside trench 79, and can be anisotropically etched to form a dielectric spacer 76A within each backside trench 79. At least one conductive material can be deposited in remaining volumes of the backside trenches 79, and excess portions of the at least one conductive material can be removed from above the top surface of the contact-level dielectric layer 280 by a planarization process. Each remaining portion of the at least one conductive material contacting a source region 61 and laterally surrounded by a respective dielectric spacer 76A constitutes a backside contact via structure 76B, which laterally extends along the first horizontal direction hd1. Each contiguous combination of a dielectric spacer 76A and a backside contact via structure 76B that fills a backside trench 79 constitutes a backside trench fill structure 76.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure 76. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

The backside trench fill structures 76 can be arranged in a configuration illustrated in FIGS. 1B-1G. In one embodiment, each first-tier retro-stepped dielectric material portion 165, each second-tier retro-stepped dielectric material portion 265, and each dielectric well structure 365 is located between and is laterally spaced from one backside trench fill structure 76 of a neighboring pair of the backside trench fill structures 76.

Figure 14A:
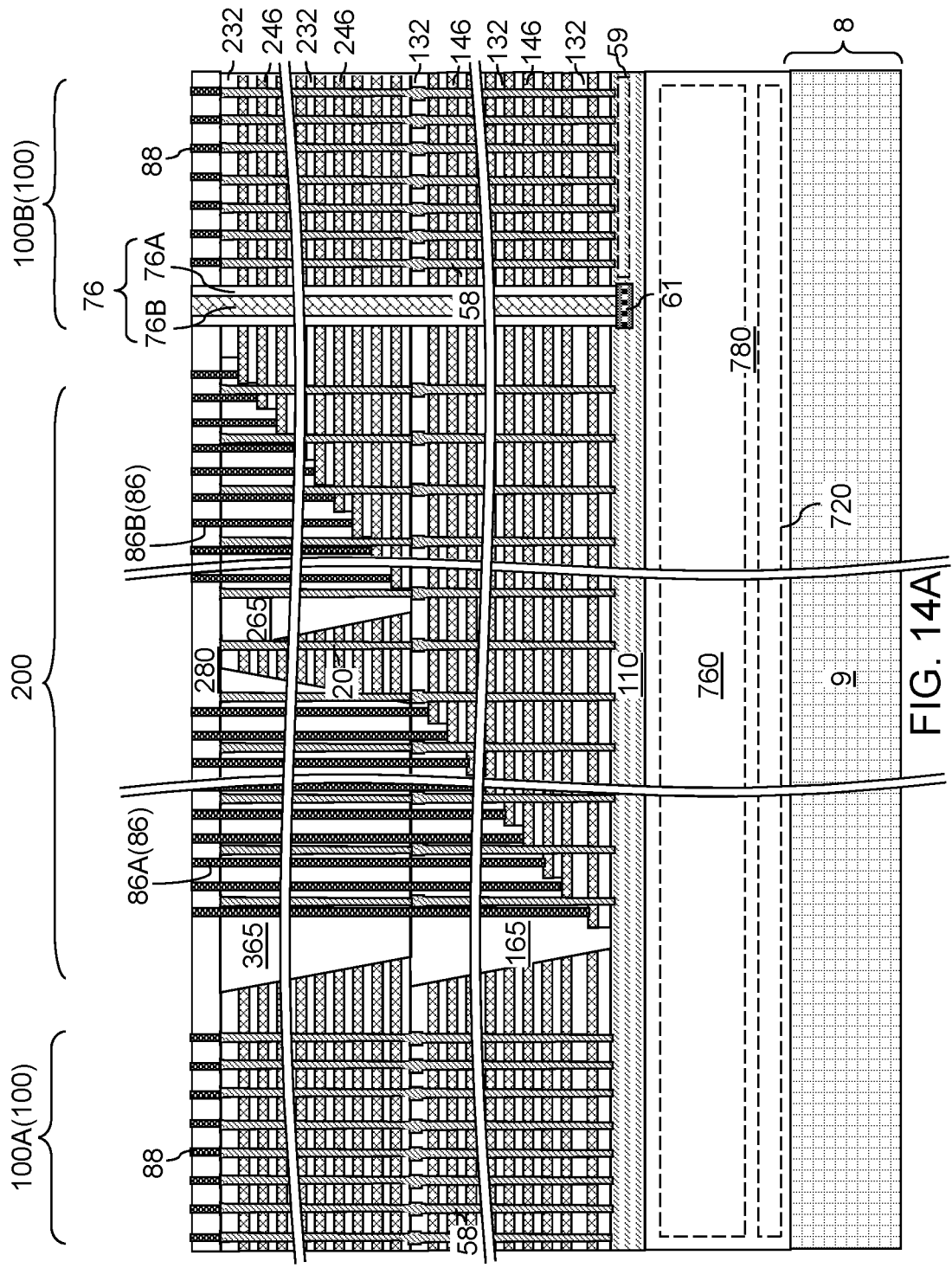
FIG. 14A is a vertical cross-sectional view of the exemplary structure after formation of various contact via structures according to an embodiment of the present disclosure.
Figure 14B:
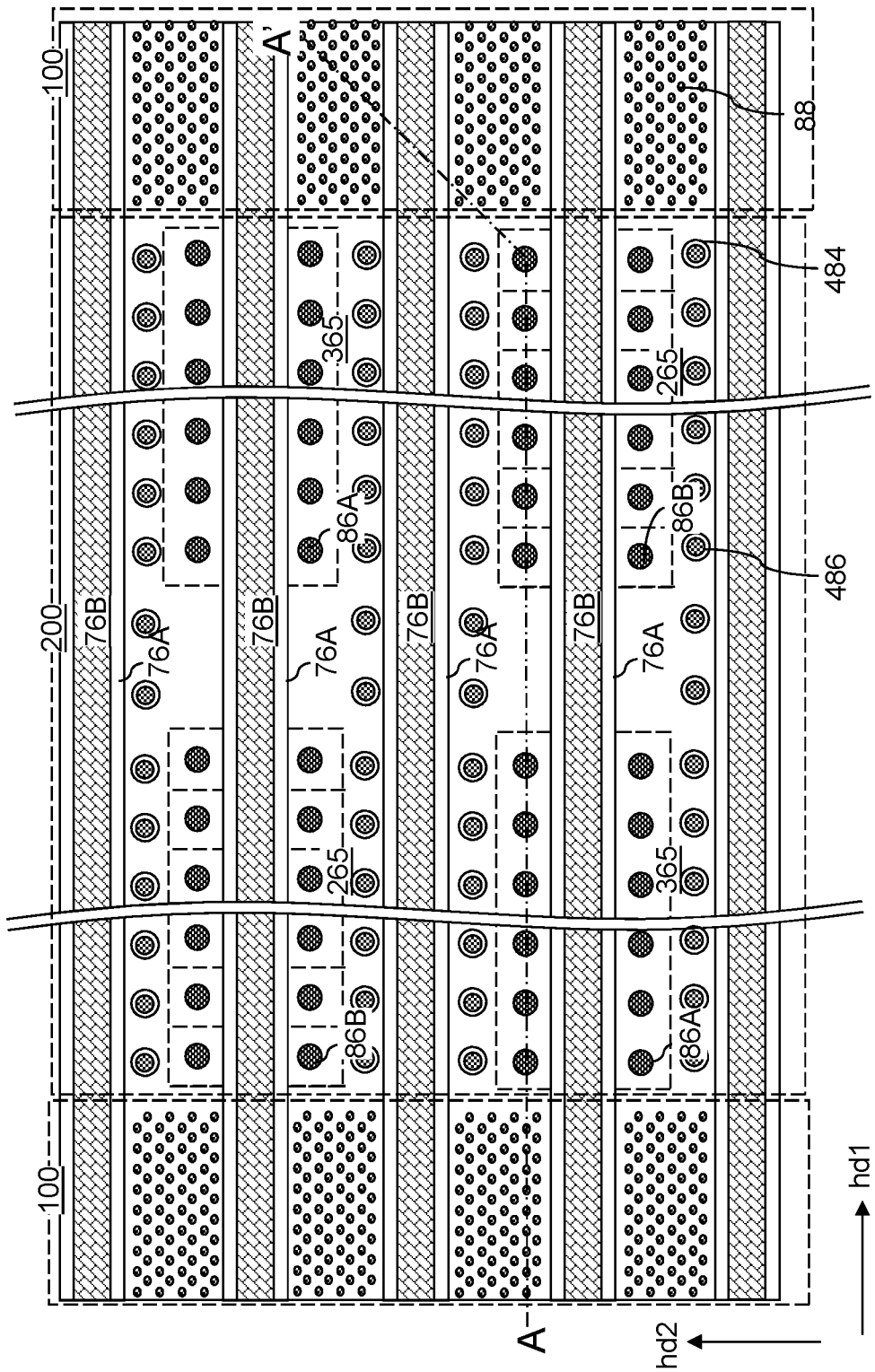
FIG. 14B is a top-down view of the exemplary structure of FIG. 14A. The hinged vertical plane A-A' is the plane of the vertical cross-sectional view of FIG. 14A.

Referring to FIGS. 14A and 14B, various contact via structures (88, 86, 486) can be formed through the contact-level dielectric layer 280 and optionally through underlying material portions onto a respective underlying conductive structure. The various contact via structures (88, 86, 486) can include drain contact via structures (e.g., drain electrodes) 88 that are formed in the memory array regions 100 through the contact-level dielectric layer 280 on a top surface of a respective drain region 63.

The various contact via structures (88, 86, 486) can include layer contact via structures 86 that are formed in the inter-array region 200 through the contact-level dielectric layer 280 and at least one retro-stepped dielectric material portion (165, 265) onto a respective one of the electrically conductive layers (146, 246). The layer contact via structures 86 can include first contact via structures 86A that are formed through a respective dielectric well structure 365 and a respective first-tier retro-stepped dielectric material portion 165 directly on a respective one of the first electrically conductive layers 146, and second contact via structures 86B that are formed through a second-tier retro-stepped dielectric material portion 265 directly on a respective one of the second electrically conductive layers 246.

Further, laterally-isolated vertical interconnection structures (484, 486) can be formed through the alternating stacks (132, 146, 232, 246) in the vertical interconnection via regions 240. Each laterally-isolated vertical interconnection structures (484, 486) can include a through-memory-level conductive via structure 486 and a tubular insulating spacer 484 that laterally surrounds the conductive via structure 486. Each through-memory-level conductive via structure 486 can contact a respective one of the lower-level metal interconnect structure 780 embedded within the lower-level dielectric material layers 760.

Bit lines (not shown) are then formed in a manner that provides electrical contact with the drain contact via structures 88. The bit lines may directly contact top surfaces of a respective subset of the drain contact via structures 88, or intermediate contact via structures (not shown) may be employed between the drain contact via structures 88 and the bit lines.

The embodiments of the present disclosure can be employed to provide staircase structures that are adjacent to each other along a direction (such as the second horizontal direction hd2, e.g., bit line direction) that is perpendicular to a lateral separation direction (such as the first horizontal direction hd1, e.g., word line direction) between a pair of memory array regions (100A, 100B). The anisotropic etch process that forms the wells through the second vertically alternating sequence (232, 242) etches through only the second vertically alternating sequence (232, 242), and does not etch through the first vertically alternating sequence (132, 142). Further, the openings in the photoresist layer for forming the wells through the second vertically alternating sequence (232, 242) are staggered along the second horizontal direction hd2. Thus, the openings in the photoresist layer are laterally spaced along the second horizontal direction at least by the pitch of backside trenches 79 along the second horizontal direction hd2. Thus, high aspect ratio openings in the photoresist layer used to pattern the wells can be avoided, and the wells through the second vertically alternating sequence (232, 242) can be formed with high pattern fidelity. Such high pattern fidelity ensures that the strip portions of the first electrically conductive layers 146 and the second electrically conductive layers 246 in the inter-tier region 200 have sufficient uniform width along the second horizontal direction hd2, and do not generate electrical opens or high resistance. Thus, the reliability of electrical connection in the inter-tier region 200 can be enhanced for the first electrically conductive layers 146 and the second electrically conductive layers 246 through use of the methods and structures of embodiments of the present disclosure. Furthermore, by staggering the neighboring staircases (i.e., of adjacent staircases along the second horizontal direction hd2) in opposite directions means that such staircases do not have to be offset from each other along the first horizontal direction hd1 to avoid the high aspect ratio photoresist layer patterns. This reduces the size of the memory device and of the semiconductor chip containing the memory device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    a first-tier alternating stack of first insulating layers and first electrically conductive layers located over a substrate;
    a first-tier retro-stepped dielectric material portion overlying first stepped surfaces of the first-tier alternating stack;
    a second-tier alternating stack of second insulating layers and second electrically conductive layers, wherein the second-tier alternating stack overlies the first-tier alternating stack and overlies a horizontal plane including a planar top surface of the first-tier retro-stepped dielectric material portion;
    memory opening fill structures located within a first memory array region and vertically extending through each layer within the first-tier alternating stack and the second-tier alternating stack, wherein each of the memory opening fill structures comprises a respective memory film and a respective vertical semiconductor channel;
    a second-tier retro-stepped dielectric material portion overlying second stepped surfaces of the second-tier alternating stack and extending through a first lateral recess region of the second-tier alternating stack; and
    a dielectric well structure contacting a top surface of the first-tier retro-stepped dielectric material portion and extending through a second lateral recess region of the second-tier alternating stack.

2. The three-dimensional memory device of claim 1, further comprising first contact via structures vertically extending through the dielectric well structure and the first-tier retro-stepped dielectric material portion and contacting a respective one of the first electrically conductive layers.

3. The three-dimensional memory device of claim 2, further comprising second contact via structures vertically extending through the second-tier retro-stepped dielectric material portion and contacting a respective one of the second electrically conductive layers.

4. The three-dimensional memory device of claim 1, further comprising:
    a first backside trench fill structure laterally extending along a first horizontal direction and contacting first sidewalls of the first-tier alternating stack and first sidewalls of the second-tier alternating stack; and
    a second backside trench fill structure laterally extending along the first horizontal direction and contacting second sidewalls of the first-tier alternating stack and second sidewalls of the second-tier alternating stack.

5. The three-dimensional memory device of claim 4, wherein the dielectric well structure comprises a first tapered sidewall that laterally extends along the first horizontal direction and located between and laterally spaced from each of the first backside trench fill structure and the second backside trench fill structure.

6. The three-dimensional memory device of claim 5, wherein:
    the dielectric well structure comprises a pair of second tapered sidewalls that laterally extend along a second horizontal direction; and
    an entirety of each of the second tapered sidewalls of the dielectric well structure contacts a respective sidewall of the second-tier alternating stack.

7. The three-dimensional memory device of claim 1, wherein an entirety of a bottom surface of the dielectric well structure is in contact with a top surface of the first-tier retro-stepped dielectric material portion.

8. The three-dimensional memory device of claim 7, wherein a first portion of a periphery of the bottom surface of the dielectric well structure is laterally offset inward from a first portion of a periphery of a top surface of the first-tier retro-stepped dielectric material portion.

9. The three-dimensional memory device of claim 1, further comprising second memory opening fill structures located within a second memory array region that is laterally offset from the first memory array region along a first horizontal direction by the second-tier retro-stepped dielectric material portion and the dielectric well structure, wherein each layer of the first-tier alternating stack and each layer of the second-tier alternating stack are present within the second memory array region.

10. The three-dimensional memory device of claim 9, wherein at least some of the first electrically conductive layers and at least some of the second electrically conductive layers continuously extend through a bridge region from the first memory array region to the second memory array region, and contact each of the second-tier retro-stepped dielectric material portion and the dielectric well structure.

11. The three-dimensional memory device of claim 1, wherein the second-tier retro-stepped dielectric material portion and the dielectric well structure comprise a same dielectric material and are laterally spaced apart from each other along a first horizontal direction by a portion of the second-tier alternating stack that laterally extends along a second horizontal direction that is perpendicular to the first horizontal direction.

12. The three-dimensional memory device of claim 1, further comprising:
  first support pillar structures that vertically extend through the dielectric well structure, the first-tier retro-stepped dielectric material portion, and a portion of the first-tier alternating stack that underlies the first-tier retro-stepped dielectric material portion; and
  second support pillar structures that vertically extend through the second-tier retro-stepped dielectric material portion, a portion of the second-tier alternating stack that underlies the second-tier retro-stepped dielectric material portion, and each layer within the first-tier alternating stack.

13. The three-dimensional memory device of claim 9, further comprising:
  an additional first-tier alternating stack of additional first insulating layers and additional first electrically conductive layers located over the substrate;
  an additional first-tier retro-stepped dielectric material portion overlying additional first stepped surfaces of the additional first-tier alternating stack;
  an additional second-tier alternating stack of additional second insulating layers and additional second electrically conductive layers, wherein the additional second-tier alternating stack overlies the additional first-tier alternating stack and overlies the horizontal plane including the planar top surface of the first-tier retro-stepped dielectric material portion;
  additional memory opening fill structures located within an additional memory array region and vertically extending through each layer within the additional first-tier alternating stack and the additional second-tier alternating stack;
  an additional second-tier retro-stepped dielectric material portion overlying additional second stepped surfaces of the additional second-tier alternating stack and extending through an additional first lateral recess region in the additional second-tier alternating stack;
  an additional dielectric well structure contacting a top surface of the additional first-tier retro-stepped dielectric material portion and extending through an additional second lateral recess region in the additional second-tier alternating stack; and
  a backside trench fill structure laterally extending along a first horizontal direction and contacting sidewalls of the first-tier alternating stack, sidewalls of the second-tier alternating stack, sidewalls of the additional first-tier alternating stack, and sidewalls of the additional second-tier alternating stack.

14. The three-dimensional memory device of claim 13, wherein:
  a lateral offset distance between the dielectric well structure and the additional second-tier retro-stepped dielectric material portion is less than a lateral offset distance between the dielectric well structure and the additional dielectric well structure; and
  a lateral offset distance between the second-tier retro-stepped dielectric material portion and the additional dielectric well structure is less than a lateral offset distance between the second-tier retro-stepped dielectric material portion and the additional second-tier retro-stepped dielectric material portion.

15. The three-dimensional memory device of claim 13, wherein:
  a vertical distance between the first stepped surfaces and the substrate increases along a first horizontal direction;
  a vertical distance between the second stepped surfaces and the substrate increases along the first horizontal direction;
  a vertical distance between the additional first stepped surfaces and the substrate decreases along the first horizontal direction; and
  a vertical distance between the additional second stepped surfaces and the substrate decreases along the first horizontal direction.

16. A method of forming a three-dimensional memory device, comprising:
  forming a first vertically alternating sequence of first insulating layers and first spacer material layers and a first-tier retro-stepped dielectric material portion overlying first stepped surfaces of the first vertically alternating sequence over a substrate, wherein the first spacer material layers are formed as, or are subsequently replaced with, first electrically conductive layers;
  forming a second vertically alternating sequence of second insulating layers and second spacer material layers over the first vertically alternating sequence and the first-tier retro-stepped dielectric material portion, wherein the second spacer material layers are formed as, or are subsequently replaced with, second electrically conductive layers;
  forming second stepped surfaces within a first opening through the second alternating stack by patterning the second alternating stack;
  forming a second-tier retro-stepped dielectric material portion over the second stepped surfaces in the first opening through the second vertically alternating sequence;
  forming a second opening through the second vertically alternating sequence over the first-tier retro-stepped dielectric material portion; and
  forming a dielectric well structure through the second vertically alternating sequence on a top surface of the first-tier retro-stepped dielectric material portion.

17. The method of claim 16, wherein:
the second opening through the second vertically alternating sequence is laterally spaced from the first opening through the second vertically alternating sequence; and
the dielectric well structure is laterally spaced from the second-tier retro-stepped dielectric material portion by a patterned portion of the second vertically alternating sequence.

18. The method of claim 16, further comprising:
  forming first contact via structures through the dielectric well structure and the first-tier retro-stepped dielectric material portion directly on a respective one of the first electrically conductive layers; and
  forming second contact via structures through the second-tier retro-stepped dielectric material portion directly on a respective one of the second electrically conductive layers.

19. The method of claim 16, further comprising:
  forming memory openings within a first memory array region in which each layer of the first vertically alternating sequence and each layer within the second vertically alternating sequence are present; and
  forming memory opening fill structures within the memory openings, wherein each of the memory opening fill structures comprises a respective memory film and a respective vertical semiconductor channel.

20. The method of claim 16, further comprising:
forming backside trenches through the second vertically alternating sequence and the first vertically alternating sequence, wherein each of the backside trenches laterally extends along a first horizontal direction; and
forming backside trench fill structures in the backside trenches, wherein each of the first-tier retro-stepped dielectric material portion, the second-tier retro-stepped dielectric material portion, and the dielectric well structure is located between, and is laterally spaced from each of, a neighboring pair among the backside trench fill structures.

\* \* \* \* \*